(12) United States Patent
Doshida

(10) Patent No.: US 7,772,743 B2
(45) Date of Patent: Aug. 10, 2010

(54) PIEZOELECTRIC DRIVE UNIT AND PIEZOELECTRIC DRIVE ELEMENT

(75) Inventor: Yutaka Doshida, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 546 days.

(21) Appl. No.: 11/652,811

(22) Filed: Jan. 12, 2007

(65) Prior Publication Data
US 2007/0182277 A1    Aug. 9, 2007

(30) Foreign Application Priority Data
Jan. 13, 2006 (JP) ............... 2006-006470
Nov. 15, 2006 (JP) ............... 2006-309536

(51) Int. Cl.
*H01L 41/08* (2006.01)
(52) U.S. Cl. ............ 310/323.02; 310/328; 310/366
(58) Field of Classification Search .......... 310/323.02, 310/328
See application file for complete search history.

(56) References Cited

U.S. PATENT DOCUMENTS

| | | | | |
|---|---|---|---|---|
| 5,027,028 A * | 6/1991 | Skipper | ............ | 310/328 |
| 6,064,140 A * | 5/2000 | Zumeris | ............ | 310/323.02 |
| 6,984,920 B2 * | 1/2006 | Yoon et al. | ............ | 310/323.12 |
| 7,061,159 B2 * | 6/2006 | Funakubo | ............ | 310/323.12 |
| 7,253,552 B2 * | 8/2007 | Miyazawa et al. | ..... | 310/323.02 |
| 7,274,131 B2 * | 9/2007 | Li et al. | ............ | 310/328 |

FOREIGN PATENT DOCUMENTS

| | | |
|---|---|---|
| JP | 4-69070 | 3/1992 |
| JP | 11-18447 | 1/1999 |
| JP | 11-44899 | 2/1999 |
| JP | 11-75382 | 3/1999 |
| JP | 2000-19376 | 1/2000 |
| JP | 2003-141827 | 5/2003 |
| JP | 2003-317410 | 11/2003 |
| JP | 2004-56951 | 2/2004 |

* cited by examiner

*Primary Examiner*—Mark Budd
(74) *Attorney, Agent, or Firm*—Law Office of Katsuhiro Arai

(57) ABSTRACT

A piezoelectric drive unit and a piezoelectric drive element are provided, which are compact and lightweight, and able to be stably displaced and positioned, in addition, efficiently driven even at low voltage. One end of a rod is fixed to an approximate center of a main surface of a piezoelectric drive element (drive element). The drive element is in a configuration where two element structures are incorporated by dividedly forming part of internal electrodes being alternately layered with a plurality of pieces of piezoelectrics, and has two regions divided with the center of the element as an origin. When signal are inputted into the internal electrodes via terminal electrodes such that a phase is shifted by 90 degrees between the two regions, the rod is rotated. When a tip of the rod is biased to be disposed by a spring such that it is pressed to a side face of a shaft for guiding a sliding frame of a lens, the lens slides along the shaft with rotation of the rod.

9 Claims, 18 Drawing Sheets

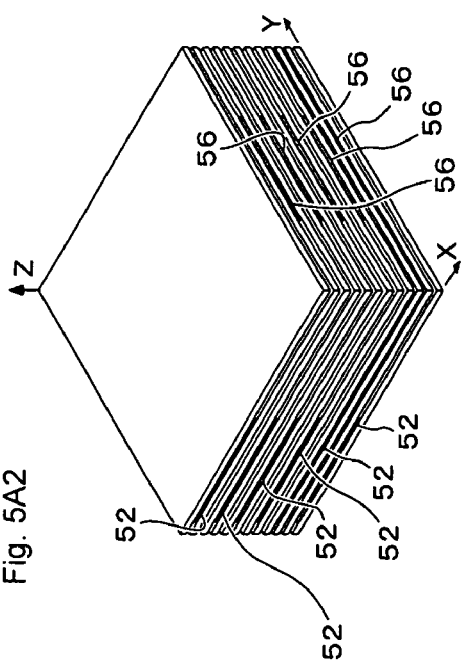
Fig. 5A1
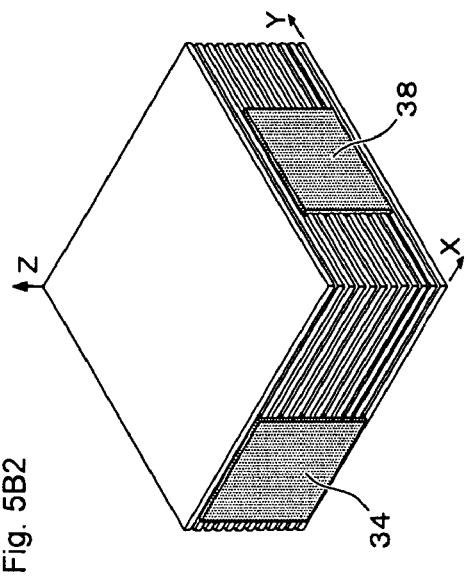
Fig. 5B1
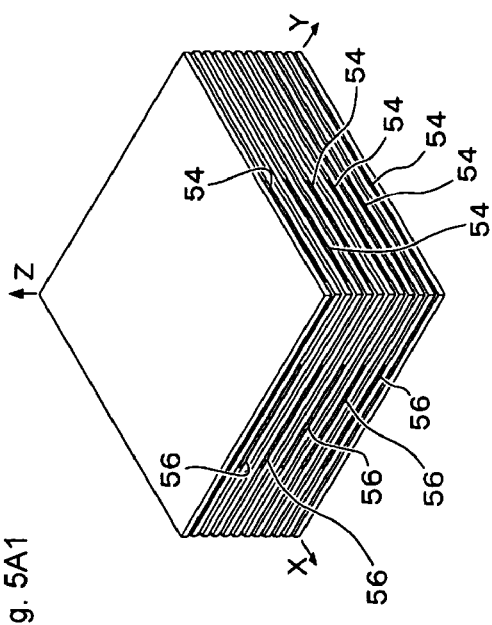
Fig. 5A2
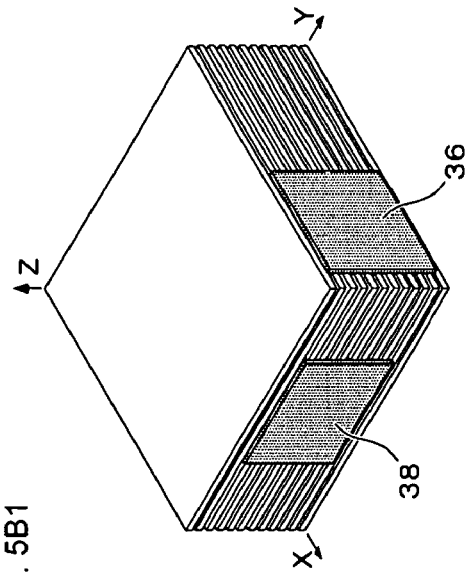
Fig. 5B2

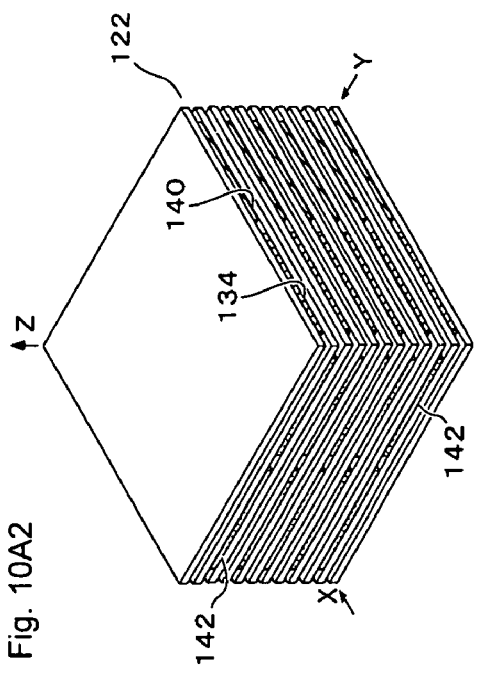
Fig. 10A1
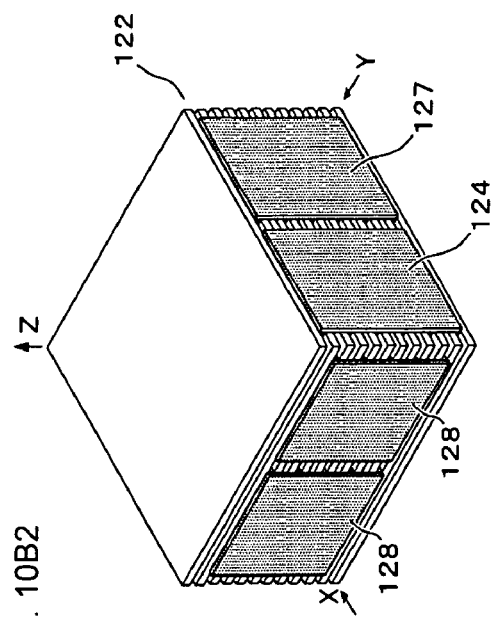
Fig. 10B2
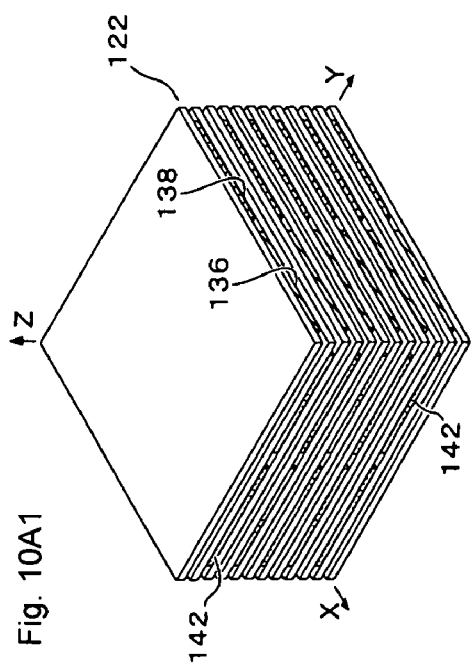
Fig. 10A1
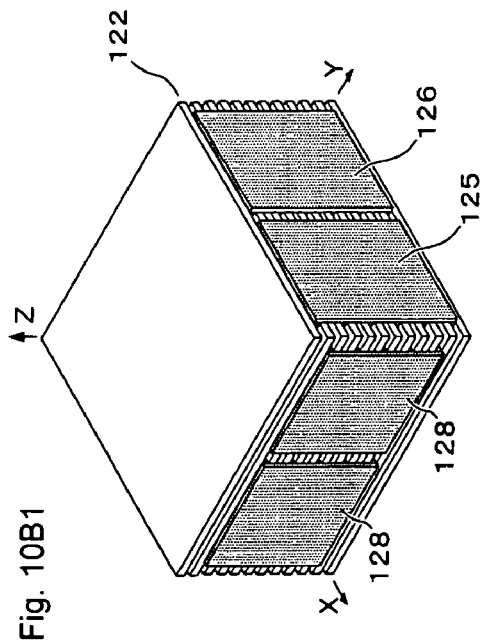
Fig. 10B1

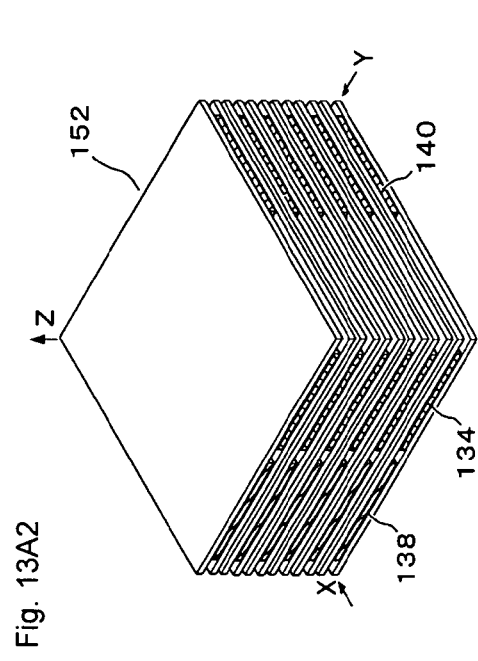
Fig. 13A2
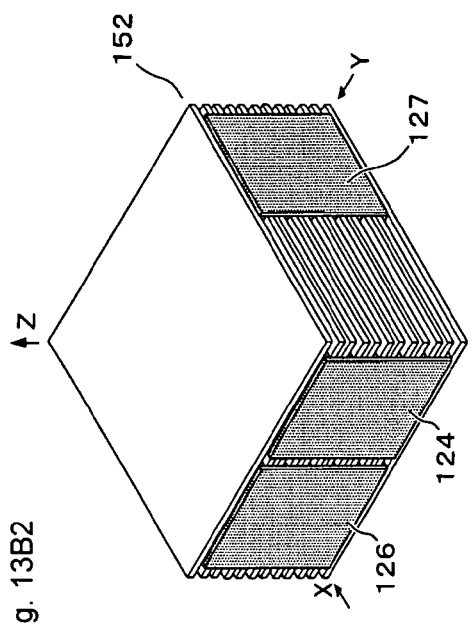
Fig. 13B2
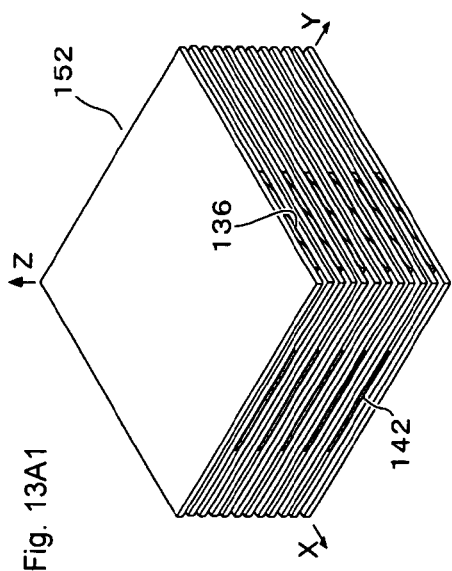
Fig. 13A1
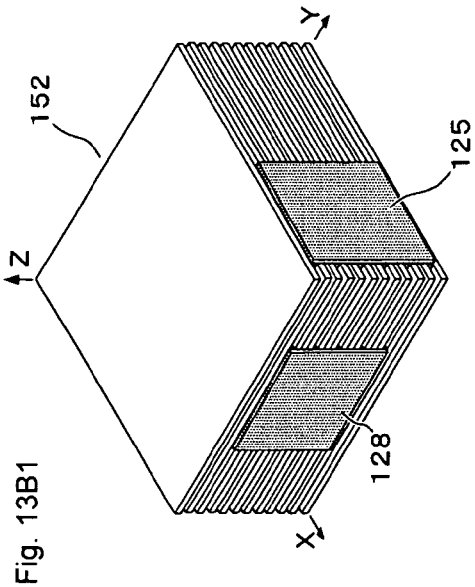
Fig. 13B1

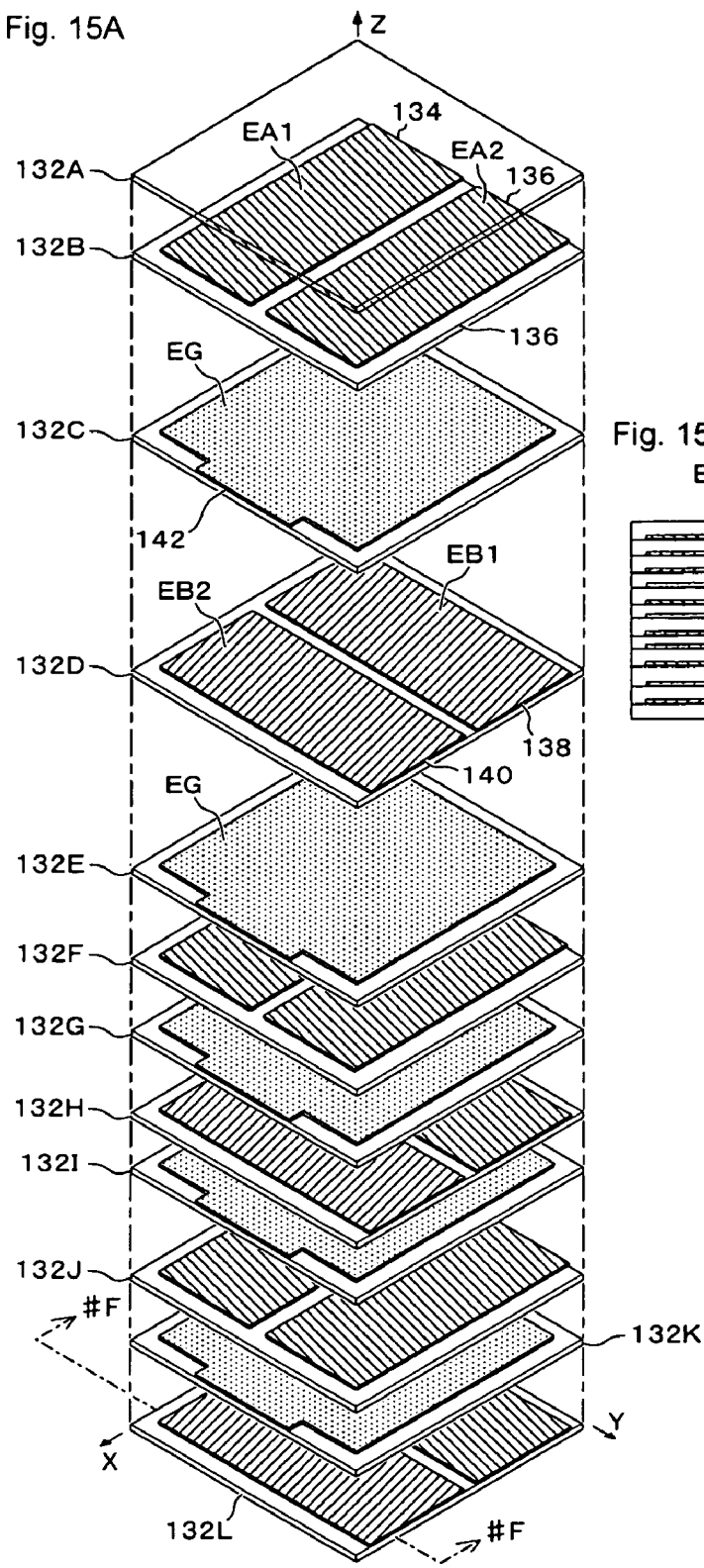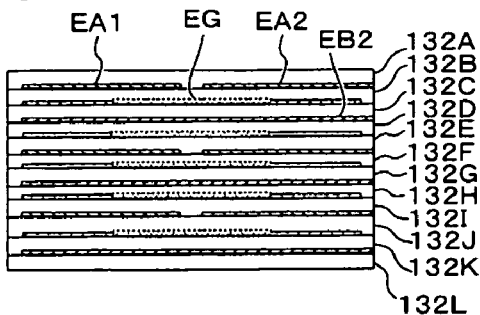
Fig. 15A
Fig. 15B

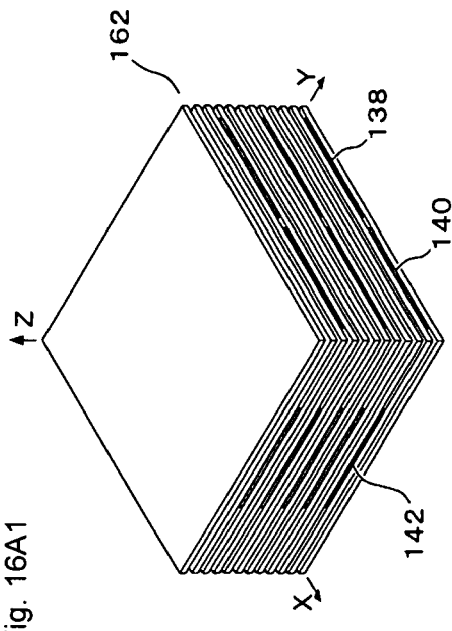
Fig. 16A1
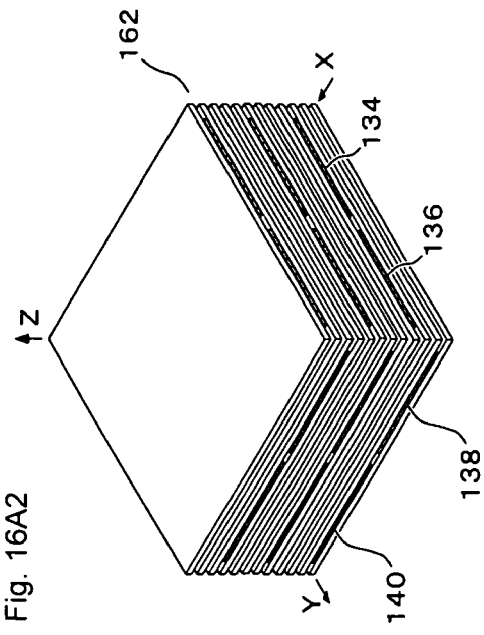
Fig. 16A2
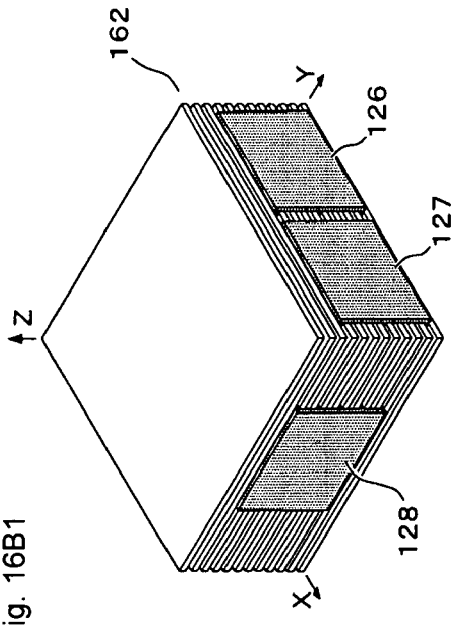
Fig. 16B1
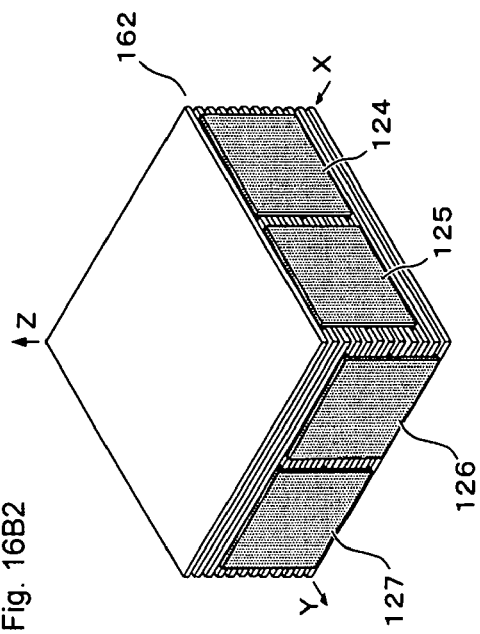
Fig. 16B2

PRIOR ART

PIEZOELECTRIC DRIVE UNIT AND PIEZOELECTRIC DRIVE ELEMENT

BACKGROUND OF THE INVENTION

1. Field of the Invention

The present invention relates to a piezoelectric drive element, and a piezoelectric drive unit (actuator) for driving a driver or a displaced body using the piezoelectric drive element.

2. Description of Related Technology

As usual driving techniques of driving lenses in an optical instrument, such as a photo-lens of a camera, a projection lens of an overhead projector, lenses of binoculars, and a lens of a copier, and of driving a typical unit having a drive section including a unit such as a plotter or an X-Y drive table, techniques disclosed in JP-A-4-069070, JP-A-11-18447, JP-A-11-44899, JP-A-11-75382, JP-A-2000-19376, JP-A-2003-141827, JP-A-2003-317410, and JP-A-2004-56951 are given. These are techniques that a piezoelectric element is slowly stretched and then quickly contracted, or quickly stretched and then slowly contracted, so that inertia force and frictional force are alternately exerted for linear driving. JP-A-4-069070 is a literature on a basic technique of the above actuator system, and JP-A-11-18447, JP-A-11-44899, JP-A-11-75382, JP-A-2000-19376, JP-A-2003-141827, JP-A-2003-317410, and JP-A-2004-56951 are literatures on how to use the system.

A mechanism of the actuator system is described with reference to FIGS. 18A to 18C. FIG. 18A is a schematic view of a drive unit, and FIGS. 18B and 18C are views showing a relationship between displacement of a piezoelectric element and time. An actuator shown in FIG. 18A is configured by a piezoelectric element 200, a shaft 202, a slider 204, and a lens 206. The piezoelectric element 200 is connected to the shaft 202 at one surface, and fixed to a body 208 at the other surface. The slider 204 is penetrated with the shaft 202, and biased to the shaft 202 by not-shown biasing elements. The slider 204 is displaced along the shaft 202 via frictional force between the slider 204 and the shaft 202 caused by the biasing elements. When the slider 204 is displaced, a lens 206 attached to an end of the slider 204 is displaced in a direction of an arrow F18a or F18b. The other end of the shaft 202 is simply held by a spring, and not fixed.

When the piezoelectric element 200 is inputted with an electric signal being asymmetrical with respect to time to be driven such that the piezoelectric element is slowly stretched and then quickly contracted as shown in FIG. 18B, when the piezoelectric element 200 is slowly stretched, the shaft 202 is moved in the direction of the arrow F18a. At that time, the slider 204 is moved with the shaft 202 by the frictional force. Then, when the piezoelectric element 200 is quickly contracted, since the slider 204 is remained at the relevant place by inertia force, and only the shaft 202 is drawn in the direction of the arrow F18b, the slider 204 is moved in the direction of the arrow F18a with respect to the shaft 202. By repeating the operation, the slider 204 is linearly driven in the direction of the arrow F18a. On the other hand, as shown in FIG. 18C, when the piezoelectric element 200 is inputted with an electric signal being asymmetrical to time to be driven such that the piezoelectric element is quickly stretched and then slowly contracted, the slider 204 is linearly driven in the direction of the arrow F18b by an effect opposite to the above effect. Since a drive mechanism of the actuator as above is simple in structure, it is practically used for an actuator for automatic focusing of a digital camera module of a cellular phone.

A lens module for a digital camera for a cellular phone is being required to inexpensively achieve improvement in performance such as high-density-pixelated optical element, zoom, automatic focus, and anti-movement of the hand. However, in the background art shown in FIGS. 18A to 18C, since the slider 204 is contacted to the shaft 202 via frictional force, they tend to be fixed to each other. In particular, since a direction of displacement of the piezoelectric element 200 is perpendicular to a direction in which fixing strength is exerted, so that displacement of the piezoelectric element 200 does not directly act on shutdown (or restraint) of the fixing strength, the piezoelectric element 200 needs to be significantly displaced to drive the slider 204, resulting in difficulties of low efficiency in driving, and difficulty in drive at low voltage.

SUMMARY OF CERTAIN INVENTIVE ASPECTS

Certain inventive aspects are aimed at providing a piezoelectric drive unit that is compact and lightweight, and able to be stably displaced and positioned at lower voltage, in addition, has high efficiency in driving, and a piezoelectric drive element.

In order to achieve the above and other objects, piezoelectric drive unit of an embodiment of the invention drives a displaced body via a rod fixed to a main surface of a piezoelectric drive element at one end, wherein one piezoelectric drive element generates torque in the rod, thereby the displaced body is driven.

In one of main modes of the piezoelectric drive unit, the piezoelectric drive element has a plurality of regions divided with the center of the element as an origin, and the plurality of regions are different in displacement in a thickness direction between adjacent regions. In another mode, the plurality of regions are two or four regions being symmetrical with respect to the rod.

In still another mode, the piezoelectric drive element has a layered structure in which a plurality of pieces of piezoelectrics and a plurality of internal electrodes are alternately layered, and at least part of the internal electrodes are dividedly formed into several pieces with the center of the piezoelectric drive element as an origin.

In still another mode, the piezoelectric drive unit has a shaft that is contacted to the rod, and guides the displaced body in motion of displacement, and biasing elements of biasing the rod to the shaft.

In still another mode, (1) the rod is rotated in a plane parallel to the rod, or (2) the rod is rotated while being inclined such that a tip of the rod is rotated in a plane perpendicular to the rod.

A piezoelectric drive element of an embodiment of the invention has a main surface being fixed with one end of a rod for driving a displaced body, wherein a plurality of pieces of piezoelectrics and a plurality of internal electrodes are alternately layered, and the piezoelectric drive element has a plurality of regions divided with the center of the element as an origin, and torque is generated in the rod using difference in displacement in a thickness direction between adjacent regions.

A piezoelectric drive unit of another embodiment of the invention has the above piezoelectric drive element, a rod to be fixed to a main surface of the piezoelectric drive element at one end, and a displaced body to be driven by torque of the rod. The described and other objects, features, and advantages of an embodiment of the invention will be clarified from the following detailed description and accompanying drawings.

In an embodiment of the invention, when a displaced body is driven via a rod fixed to a main surface of a piezoelectric drive element at one end, torque is generated in the rod by one piezoelectric drive element, thereby the displaced body is driven. Therefore, since fixing strength is efficiently restrained or shut off, so that the displaced body can be driven fast, stably, and efficiently even at low voltage.

BRIEF DESCRIPTION OF THE DRAWINGS

FIGS. 1A to 1B are views showing embodiment 1 of the invention, wherein FIG. 1A is a plane view seen in a direction of optical axis, and FIG. 1B is a cross section view along a line #A-#A of the FIG. 1A;

FIGS. 2A to 2C are views showing a drive element and a rod of the embodiment 1, wherein FIG. 2A is a front view, and FIGS. 2B and 2C are perspective views;

FIGS. 3A to 3B are views showing the drive element of the embodiment 1, wherein FIG. 3A is an exploded perspective view showing a layered structure, and FIG. 3B is a cross section view along a line #B-#B of the FIG. 3A;

FIGS. 4A to 4B are views showing the drive element of the embodiment 1, wherein FIG. 4A is a plane view showing arrangement of internal electrodes, and FIG. 4B is a schematic view showing displacement distribution in a thickness direction;

FIGS. 5A1 to 5B2 are perspective views of the drive element of the embodiment 1, wherein FIGS. 5A1 and 5A2 are views showing leading portions of internal electrodes, and FIGS. 5B-1 and 5B-2 are views showing arrangement of terminal electrodes;

FIGS. 7A to 7B are views showing embodiment 2 of the invention, wherein FIG. 2A is a plane view seen in a direction of optical axis, and FIG. 2B is a cross section view along a line #C-#C of the FIG. 7A;

FIGS. 8A to 8C are views showing a drive element and a rod of the embodiment 2, wherein FIG. 8A is a front view, and FIGS. 8B and 8C are perspective views;

FIGS. 9A to 9C are views showing the drive element of the embodiment 2, wherein FIG. 9A is an exploded perspective view showing a layered structure, FIG. 9B is a cross section view along a line #D-#D of the FIG. 9A, and FIG. 9C is a schematic view showing displacement distribution in a thickness direction;

FIGS. 10A1 to 10B2 are perspective views of the drive element of the embodiment 2, wherein FIGS. 10A1 and 10A2 are views showing leading portions of internal electrodes, and FIGS. 10B1 and 10B2 are views showing arrangement of terminal electrodes;

FIGS. 11A to 11C are views showing a drive element and a rod of the embodiment 3, wherein FIG. 11A is a front view, and FIGS. 11B and 11C are perspective views;

FIGS. 12A to 12B are views showing the drive element of the embodiment 3, wherein FIG. 12A is an exploded perspective view showing a layered structure, and FIG. 12B is a cross section view along a line #E-#E of the FIG. 12A;

FIGS. 13A1 to 13B2 are perspective views of the drive element of the embodiment 3, wherein FIGS. 13A1 and 13A2 are views showing leading portions of internal electrodes, and FIGS. 13B1 and 13B2 are views showing arrangement of terminal electrodes;

FIGS. 14A to 14C are views showing a drive element and a rod of embodiment 4, wherein FIG. 14A is a front view, and FIGS. 14B and 14C are perspective views;

FIGS. 15A to 15B are views showing the drive element of the embodiment 4, wherein FIG. 15A is an exploded perspective view showing a layered structure, and FIG. 15B is a cross section view along a line #F-#F of the FIG. 15A;

FIG. 16A1 to 16B2 are perspective views of the drive element of the embodiment 4, wherein FIGS. 16A1 and 16A2 are views showing leading portions of internal electrodes, and FIGS. 16B1 and 16B2 are views showing arrangement of terminal electrodes;

DESCRIPTION OF THE PREFERRED EMBODIMENT

Various aspects and features of the invention will become more fully apparent from the following description of embodiments and appended claims taken in conjunction with the foregoing drawings.

Figure 1A:
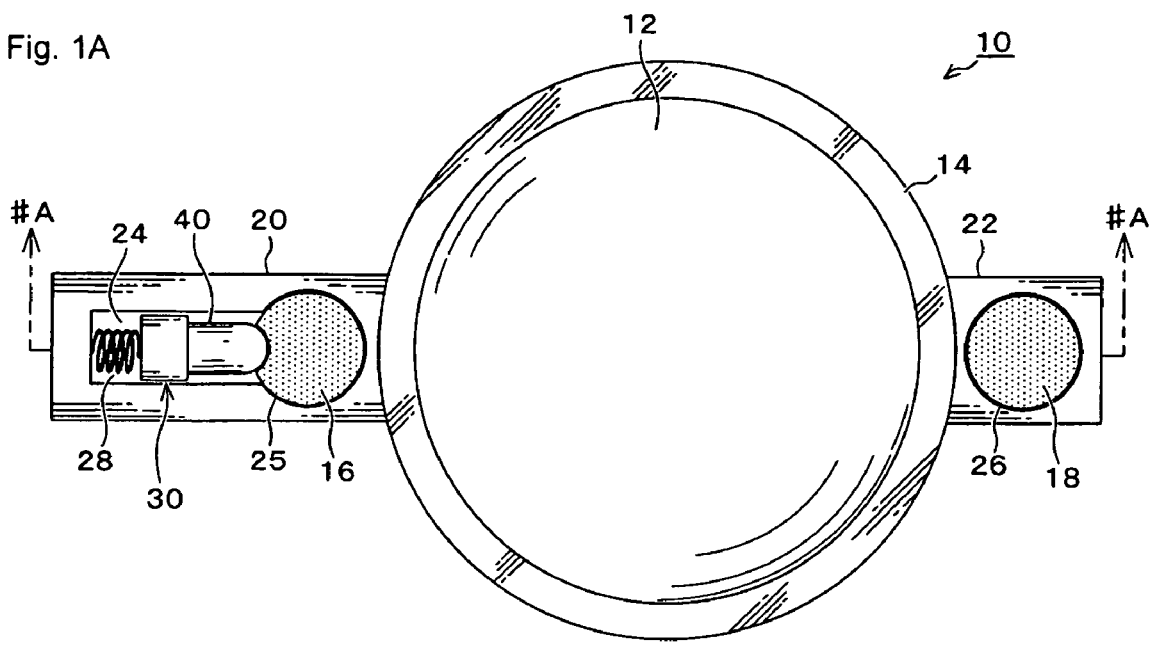
Figure 1B:
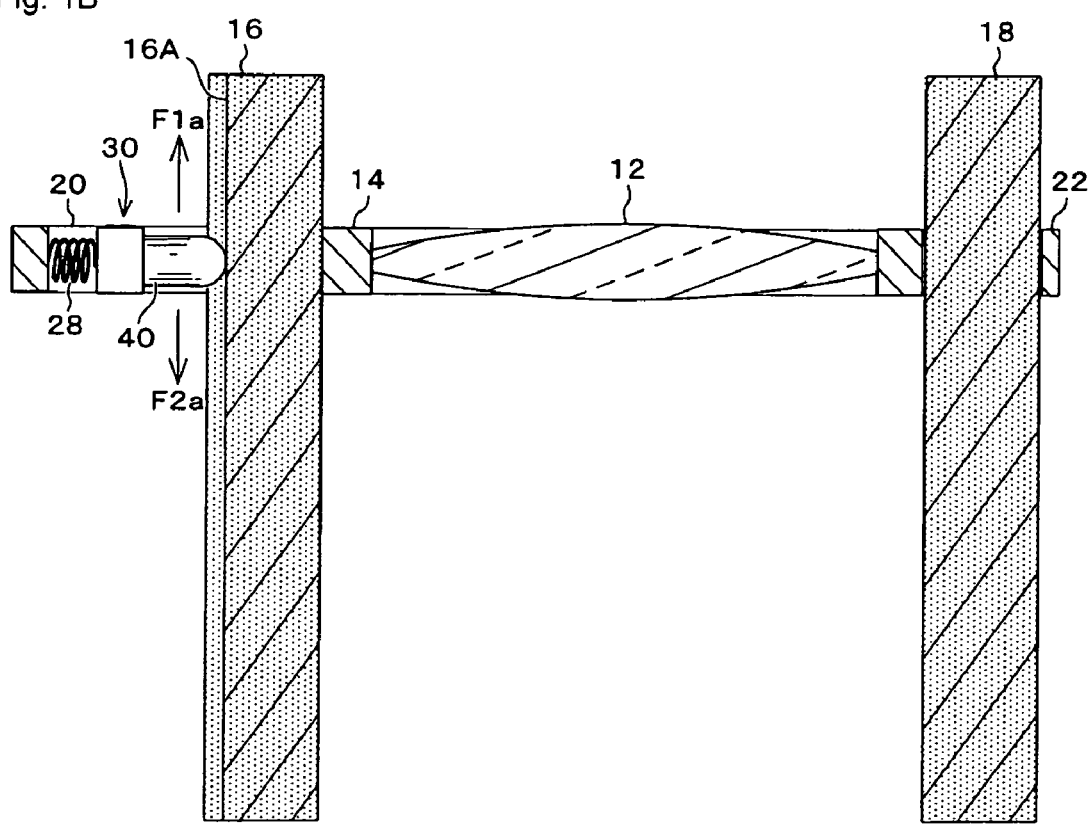

First, embodiment 1 of the invention is described with reference to FIGS. 1A to FIG. 6. A basic structure of the embodiment is first described with reference to FIGS. 1A to 1B. The embodiment is an example of using an embodiment of the invention for a piezoelectric drive unit (actuator) of a lens for focus of an optical instrument. FIG. 1A is a plane view of the piezoelectric drive unit of the embodiment, which is seen along an optical axis; and FIG. 1B is a cross section view along a line #A-#A of the FIG. 1A, which is seen in an arrow direction. The piezoelectric drive unit (actuator) 10 moves or displaces a lens 12 as a displaced body, and includes the lens 12, a pair of shafts 16 and 18, a frame 14 that holds the lens 12 and is movable along the shafts 16 and 18, a piezoelectric drive element (hereinafter, drive element) 30 attached to the frame 14, and a rod 40.

The frame 14 has protrusions 20 and 22 protruded in a radial direction of the lens 12, and one protrusion 20 has an opening 24 having a section in an approximately rectangular shape for attaching the drive element 30, and an opening 25 having a section in an approximately circular shape to be penetrated with the shaft 16. The openings 24 and 25 are continuously formed. The other protrusion 22 has an approximately circular opening 26 for penetration of the shaft 18. While the shafts 16 and 18 may be in any shape such as a cylindrical or prismatic shape, they are in an approximately cylindrical shape in the embodiment. When they are in a shape other than the cylindrical shape, shapes of the openings 25 and 26 are modified depending on shapes of the shafts 16 and 18.

The shaft 16, which is to be contacted to the rod 40 fixed to the drive element 30, has a groove 16A formed thereon in an axial direction, the groove having such a shape that a curved portion in a tip of the rod 40 is fitted therein. The rod 40 is disposed such that it is pressed to the shaft 16 via the drive element 30 by a spring (biasing element) 28 provided in the opening 24. The other shaft 18 has play to prevent the shaft from hindering movement of the frame 14. While two shafts 16 and 18 are provided to guide the frame 14 in travel motion in the embodiment, the shaft 18 can be provided as necessary.

Figure 2A:
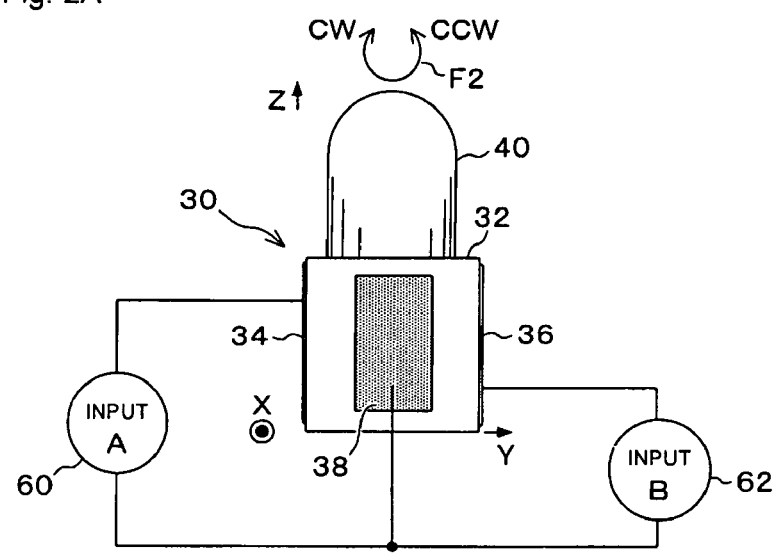
Figure 2B:
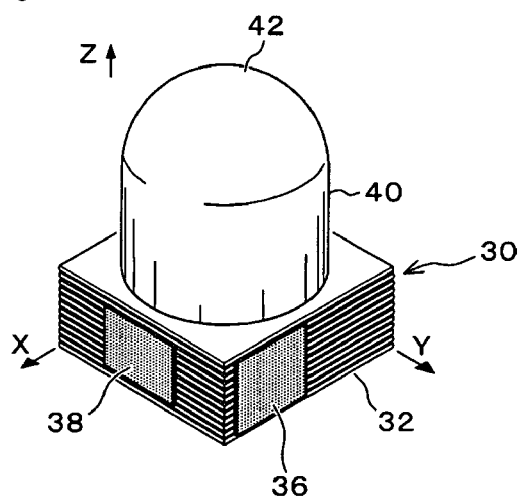
Figure 2C:
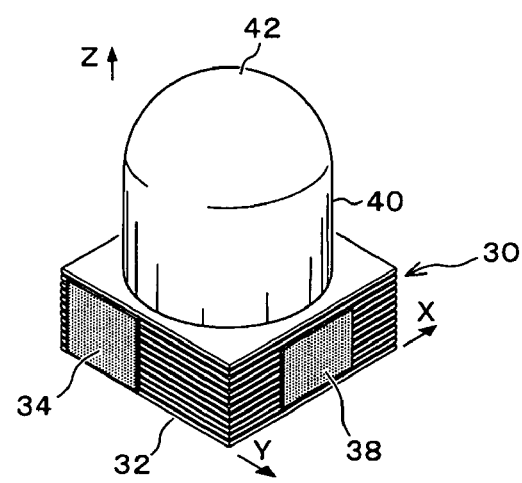
Figure 3A:
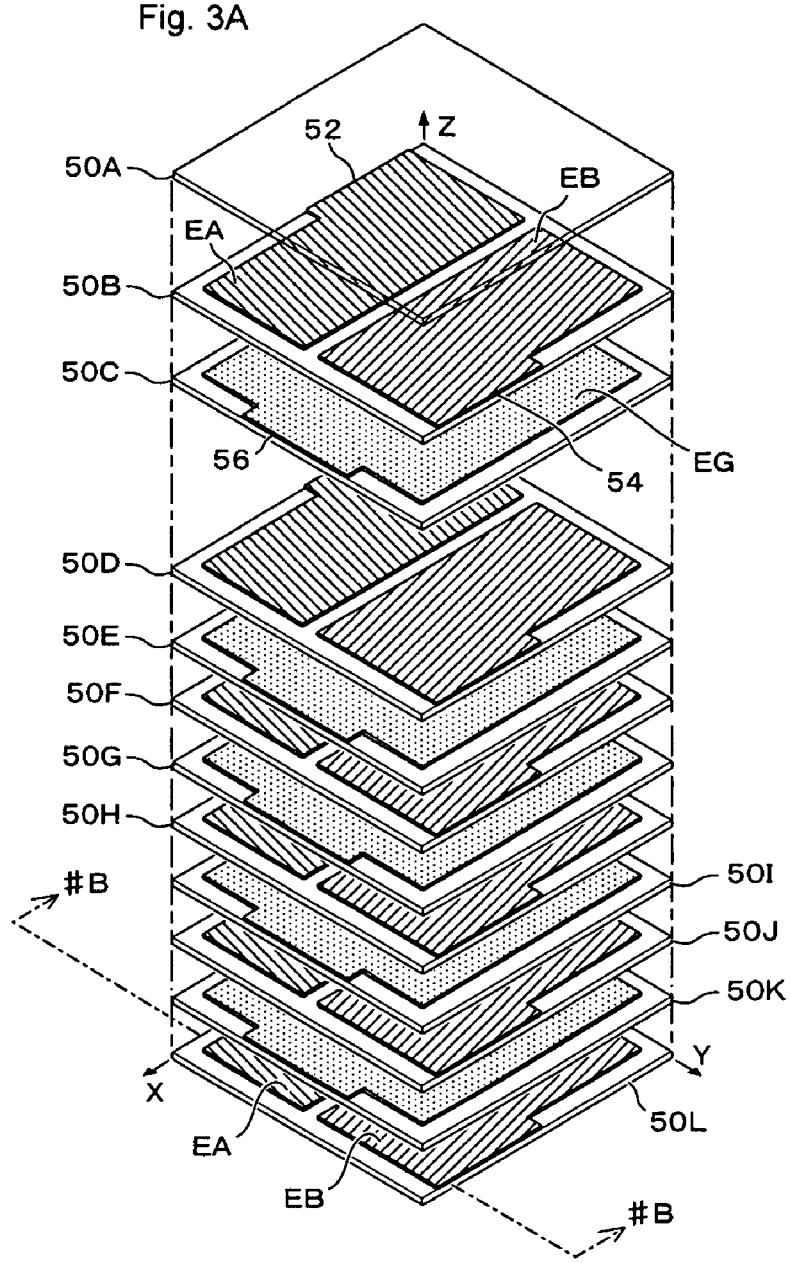
Figure 3B:
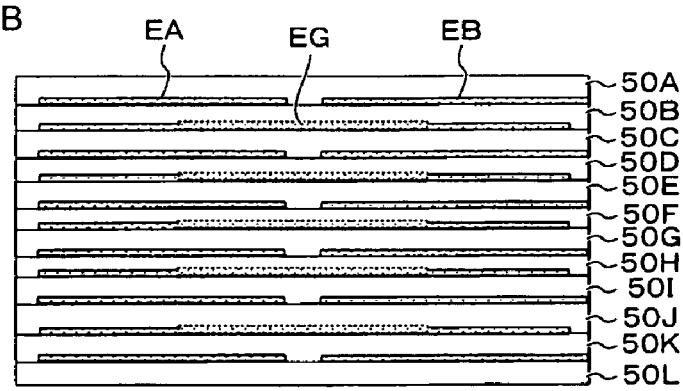
Figure 4A:
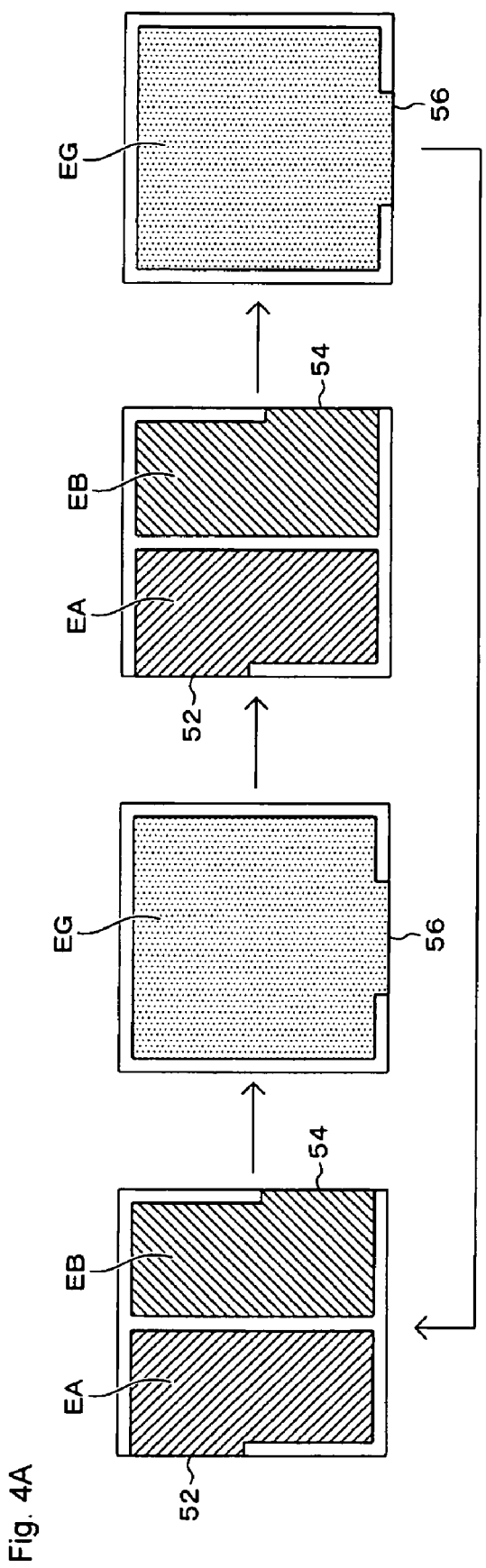
Figure 4B:
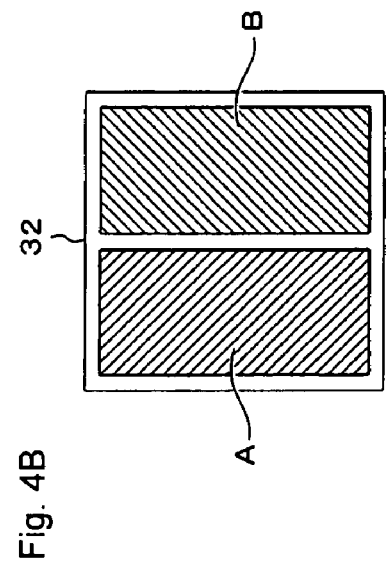

Next, the drive element 30 is described with reference to FIGS. 2A to 5B2. FIG. 2A is a front view of the drive element 30 and the rod 40; and FIGS. 2B and 2C are perspective views of them. FIG. 3A is an exploded perspective view showing a layered structure of the drive element 30; and FIG. 3B is a cross section view along a line #B-#B of the FIG. 3A, which is seen in an arrow direction. FIG. 4A is a plane view showing arrangement of internal electrodes of the drive element 30; and FIG. 4B is a schematic view showing displacement distribution in a thickness direction of the drive element 30. FIGS. 5A1 to 5B2 are perspective views of the drive element 30, wherein FIGS. 5A1 and 5A2 are views showing leading portions of internal electrodes, and FIGS. 5B1 and 5B2 are views showing arrangement of terminal electrodes.

As shown in FIGS. 1A to 1B and FIGS. 2A to 2C, one end of the rod 40 is fixed to an approximate center of a main surface of the drive element 30. A tip 42 of the rod 40 is in an approximately semicircular shape so that it fits in the groove 16A formed on the shaft 16. Such a rod 40 is formed of metal or the like. The drive element 30 is in a layered structure via electrodes as a known multilayer ceramic capacitor in order to obtain submicron displacement even in a non-resonant state.

A more detailed structure of the drive element 30 is described with reference to FIGS. 3A to 3B and 4A to 4B. The drive element 30 has a structure where a plurality of piezoelectrics 50A to 50L and a plurality of internal electrodes EA, EB and EG are alternately layered. The piezoelectrics 50A is disposed at an uppermost layer, and internal electrodes EA and EB are provided between the piezoelectrics 50A and piezoelectrics 50B as an underlayer thereof. The internal electrodes EA and EB are in a pattern of point symmetry about the center of the element, and the internal electrode EA has a leading portion 52 of the electrode, and the internal electrode EB has a leading portion 54. Then, the internal electrode EG is provided as a ground electrode between piezoelectrics 50B and piezoelectrics 50C. The internal electrode EG has a leading portion 56. Furthermore, the internal electrodes EA and EB are provided between piezoelectrics 50C and piezoelectrics 50D.

In this way, in the embodiment, the divided internal electrodes EA and EB and the internal electrode EG are alternately layered via the piezoelectrics, thereby a layered product 32 is obtained, as shown in FIG. 4A. As shown in FIGS. 5A1 and 5A2, in the layered product 32, the leading portions 52, 54 and 56 of the electrodes are exposed on side faces, and the leading portions 52, 54 and 56 are connected with terminal electrodes 34, 36 and 38 respectively as shown in FIGS. 5B1 and 5B2, thereby a drive element 30 in a three-terminal type is formed. For example, PZT is used for the piezoelectrics 50A to 50L, and for example, Ag/Pd is used for the internal electrodes EA, EB and EG and the terminal electrodes 34, 36 and 38.

As shown in FIGS. 2A to 2C, one end of the rod 40 is adhered to the approximate center of the main surface of the drive element 30 in a configuration as above by an appropriate method. A driving power supply 60 is connected between the terminal electrodes 34 and 38 of the drive element 30, and a driving power supply 62 is connected between the terminal electrodes 36 and 38. When an alternate signal is inputted such that phases of the internal electrodes EA and EB are shifted by 90 degrees from each other, displacement is induced in one drive element 30, in which phases are shifted by 90 degrees on the sides of the rod 40. That is, as shown in FIG. 4B, the drive element 30 has two regions A and B having different displacement in a thickness direction from each other. Thus, vertical vibration and bending vibration are generated in the rod 40, and the tip 42 of the rod 40 makes a rotational movement in a plane parallel to the rod 40 as shown by an arrow F2 in FIG. 2A.

It was confirmed that when the drive element 30 of the embodiment was inputted with a driving signal as shown in the following table 1, in the case that phase difference between the internal electrodes EA and EB was 90 degrees, the rod 40 was rotated clockwise (CW), and in the case that the phase difference was −90 degrees, it was rotated counterclockwise (CCW).

TABLE 1

| Input | CW | CCW |
|---|---|---|
| A | Esinωt | Ecosωt |
| B | Ecosωt | Esinωt |

Next, operation of the embodiment is described. As shown in FIGS. 1A to 1B, the drive element 30 in the above configuration is attached within the protrusion 20 of the frame 14 holding the lens 12 via the spring 28, so that the tip 42 of the rod 40 is contacted to the groove 16A of the shaft 16. Then, due to friction induced between the rod 40 pressed to the shaft by the spring 28 and the shaft 16, the rod 40 is displaced upward (in a direction of an arrow F1a in FIG. 1B) when the rod 40 is rotated CW (clockwise), and the rod 40 is displaced downward (in a direction of an arrow F1b in FIG. 1B) when the rod 40 is rotated CCW (counterclockwise).

Figure 6:
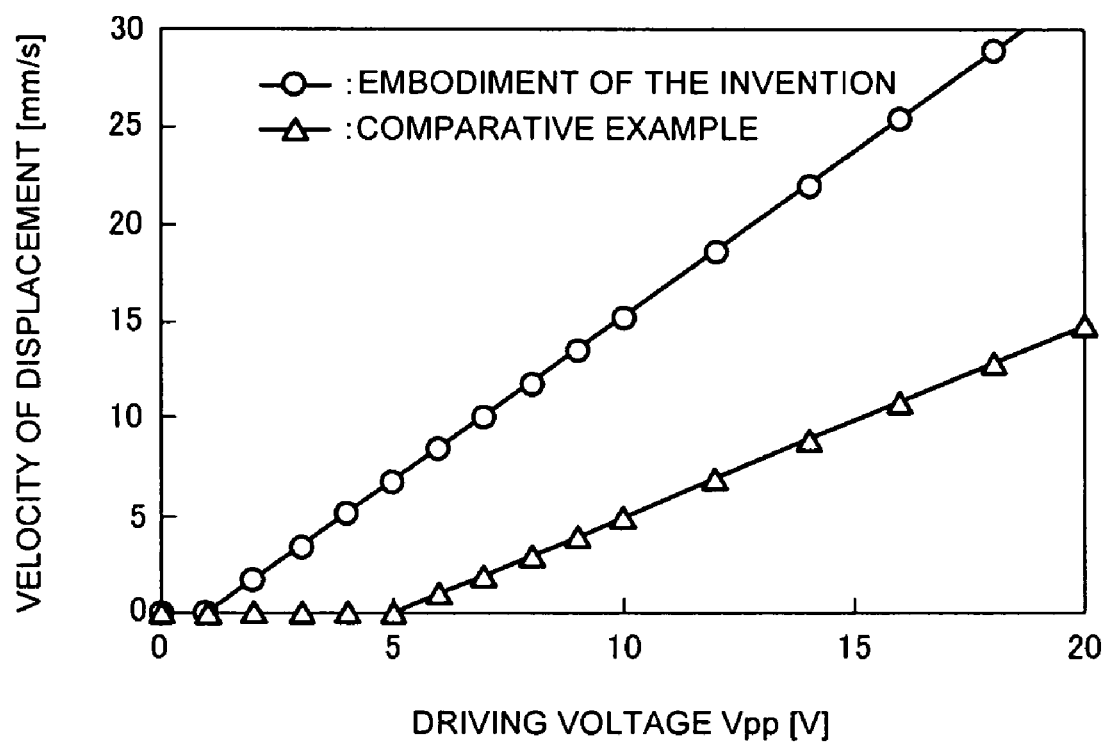
FIG. 6 is a view showing a relationship between velocity of displacement of a lens and a driving voltage for each of the embodiment 1 and a comparative example.
Figure 18A:
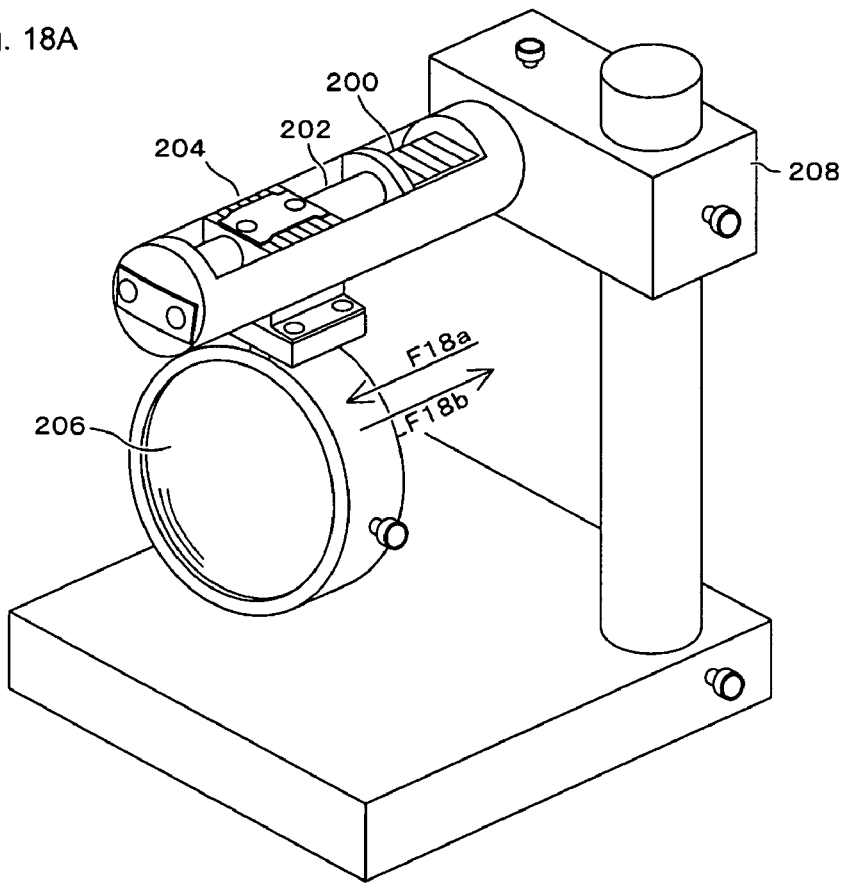
FIGS. 18A to 18C are views showing an example of a background art.
Figure 18B:
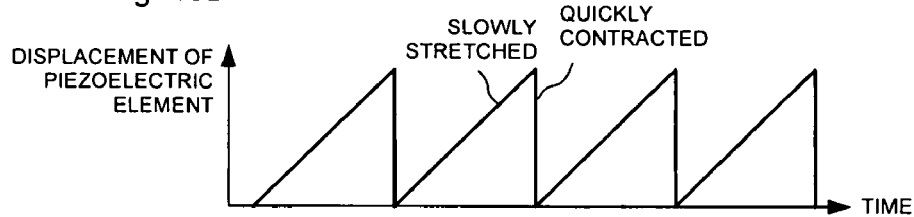
Figure 18C:
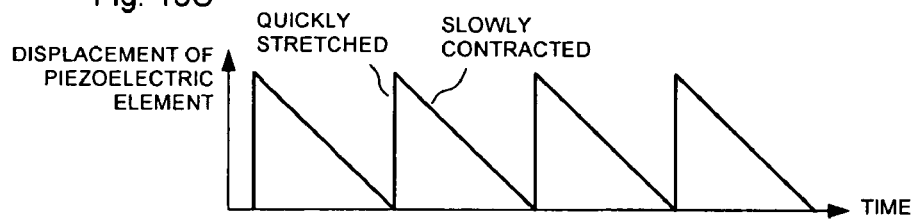

FIG. 6 shows a measurement result showing a relationship between a driving voltage of the drive element 30 and velocity of displacement of the lens 12 for each of the embodiment and a comparative example. In FIG. 6, a horizontal axis shows the driving voltage Vpp (V), and a vertical axis shows the velocity of displacement (mm/s) of the lens 12. The comparative example has the same configuration as that of the drive unit in the related art as shown in FIG. 18A. As shown in FIG. 6, it was confirmed that the element was started to be driven at low voltage, and furthermore the velocity of displacement was high in the embodiment 1 compared with the comparative example.

In this way, in the embodiment 1, one drive element 30 incorporates two element structures so that torque is generated in the rod 40, which was fixed to the main surface of the drive element 30 at one end, to drive the lens 12. Therefore, the fixing strength is efficiently restrained or shut off, and consequently an efficient drive unit 10 can be obtained, which operates stably and fast even if displacement of the drive element 30 is small at low voltage while being compact and lightweight.

Figure 7A:
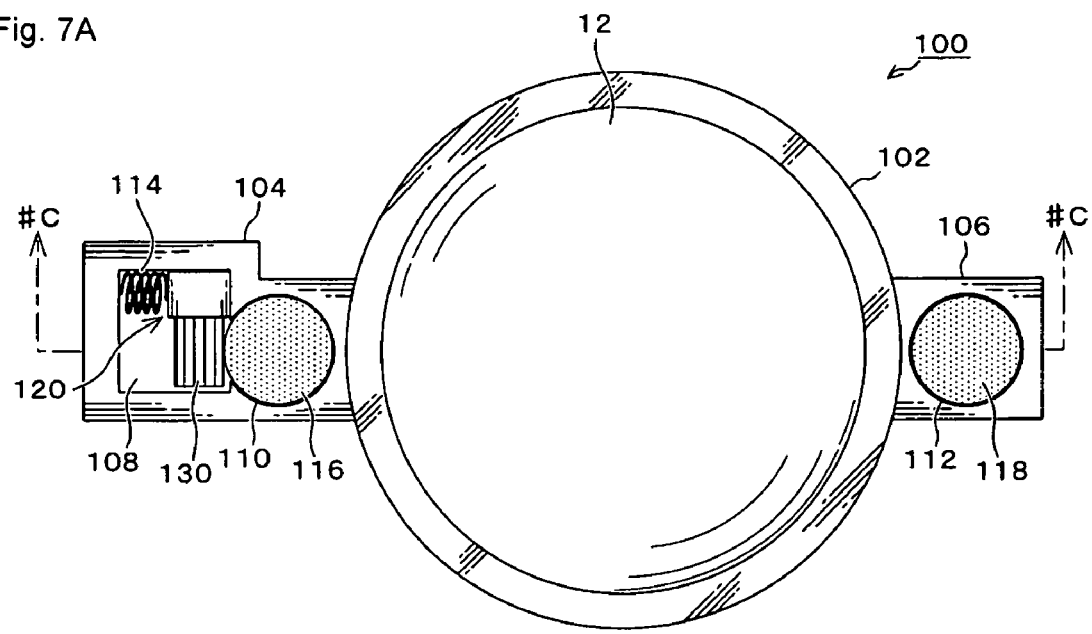
Figure 7B:
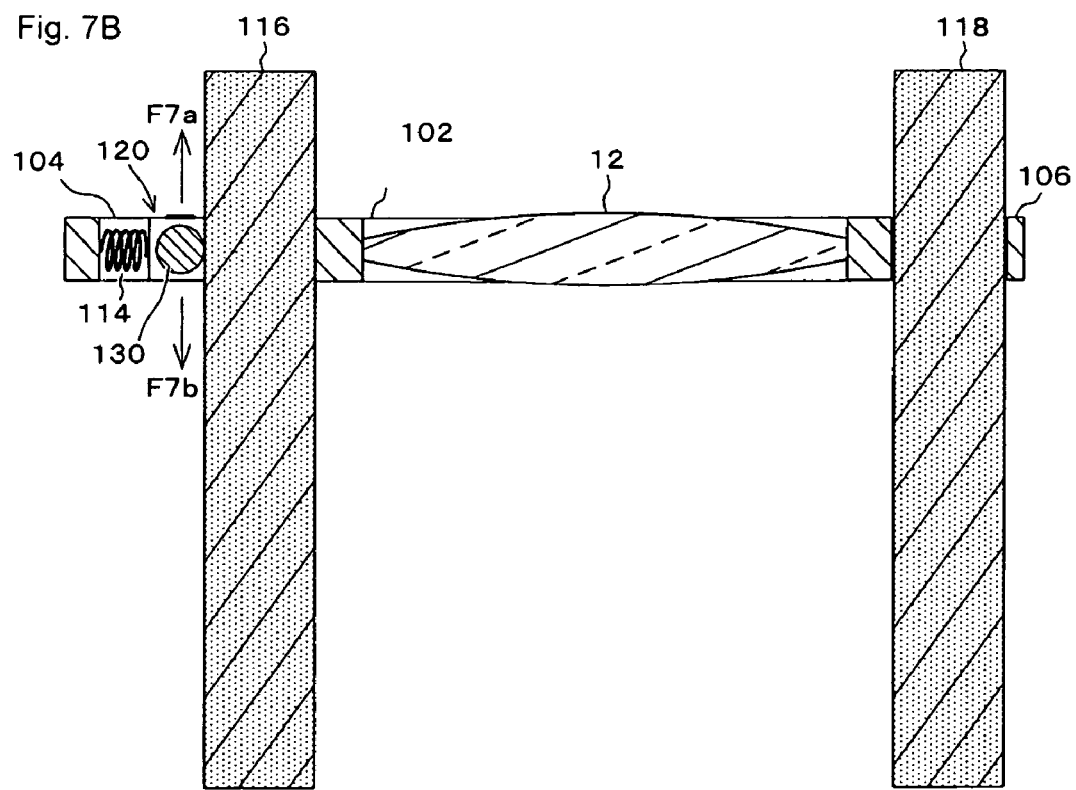

Next, embodiment 2 of the invention will be described with reference to FIGS. 7A to 10B2. The same signs are used for components equal or corresponding to those in the embodiment 1 (this is the same in subsequent embodiments). First, a basic structure of the embodiment is described with reference to FIGS. 7A to 7B. FIG. 7A is a plane view of a drive unit of the embodiment, which is seen along an optical axis; and FIG. 7B is a cross section view along a line #C-#C of the FIG. 7A, which is seen in an arrow direction. A piezoelectric drive unit (hereinafter, drive unit) 100 includes a lens 12 as a displaced body, a pair of shafts 116 and 118, a frame 102 that holds the lens 12 and is movable along the shafts 116 and 118, a piezoelectric drive element (hereinafter, drive element) 120 attached to the frame 102, and a rod 130.

The frame 102 has protrusions 104 and 106 protruded in a radial direction of the lens 12, and one protrusion 104 has an opening 108 having a cross section in an approximately rectangular shape for attaching the drive element 120, and an opening 110 having a cross section in an approximately circular shape to be penetrated with the shaft 116. The openings 108 and 110 are continuously formed. The other protrusion 106 has an opening 112 having a cross section in an approximately circular shape for penetration of the shaft 118. The shafts 116 and 118 are in an approximately cylindrical shape in the embodiment. The rod 130 fixed to the drive element 120 is disposed such that a side face of the rod is pressed to a side face of the shaft 116 by a spring 114 provided in the opening 108. The shaft 116 is approximately perpendicular to the rod 130. The embodiment is the same as the embodiment 1 in that the other shaft 118 has play for preventing the shaft from hindering movement of the lens 12, or the shaft 118 is utilized as necessary.

Figure 8A:
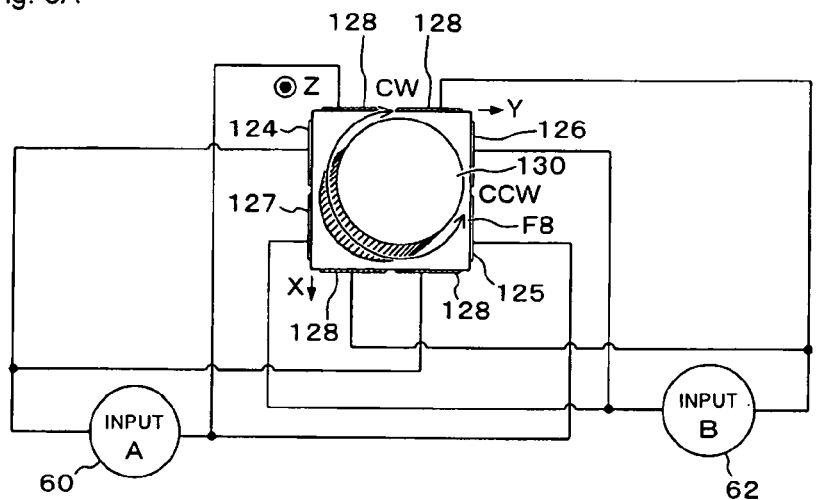
Figure 8B:
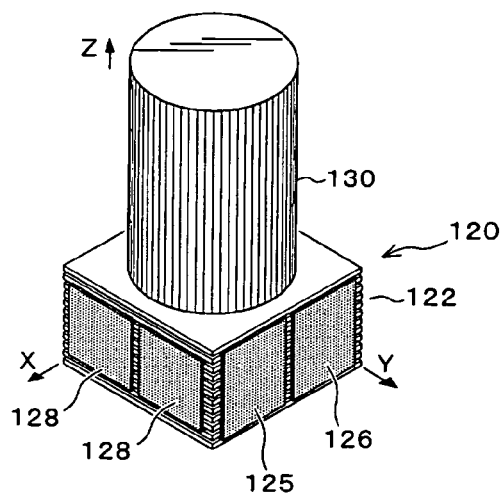
Figure 8C:
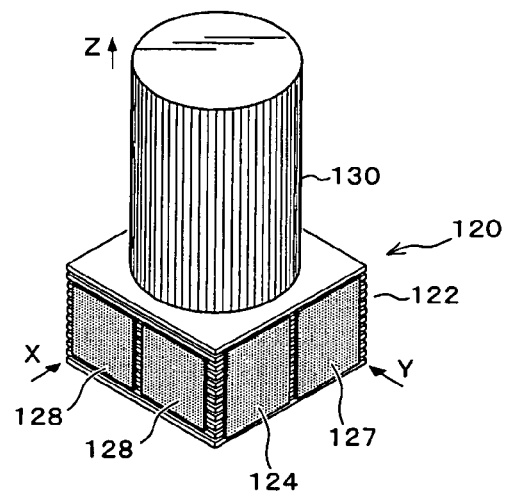
Figure 9A:
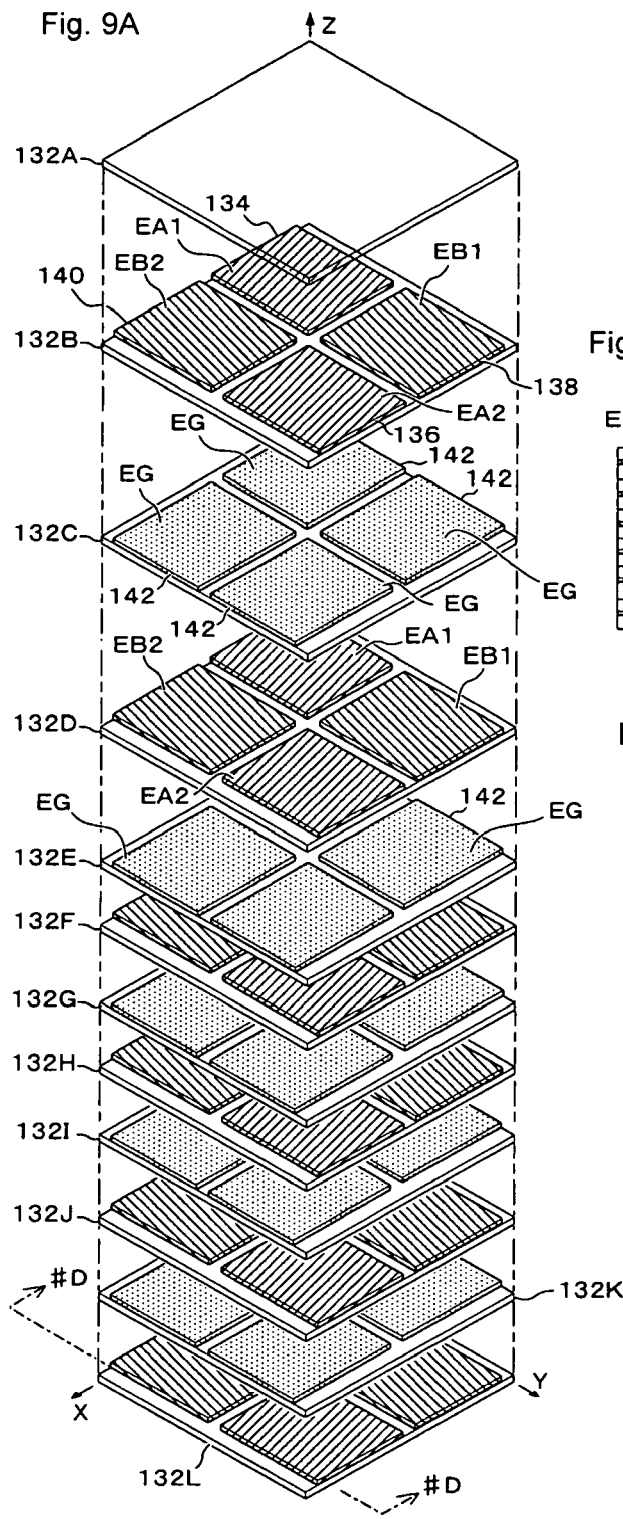
Figure 9B:
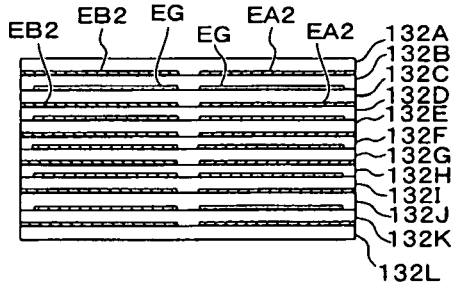
Figure 9C:
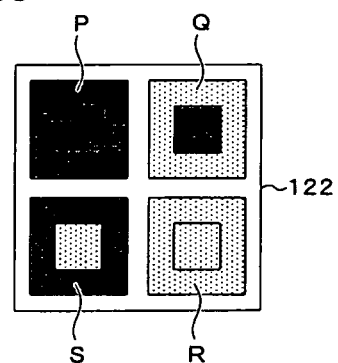

Next, the drive element 120 is described with reference to FIGS. 8A to FIGS. 10B2. FIG. 8A is a front view of the drive element 120 and the rod 130; and FIGS. 8B and 8C are perspective views of them. FIG. 9A is an exploded perspective view showing a layered structure of the drive element 120; FIG. 9B is a cross section view along a line #D-#D of the FIG. 9A, which is seen in an arrow direction; and FIG. 9C is a schematic view showing displacement distribution in a thickness direction of the drive element 120. FIGS. 10A1 to 10B2 are perspective views of the drive element 120, wherein FIGS. 10A1 and 10A2 are views showing leading portions of internal electrodes, and FIGS. 10B1 and 10B2 are views showing arrangement of terminal electrodes.

As shown in FIGS. 7A to 7B and FIGS. 8A to 8C, one end of the rod 130 is fixed to an approximate center of a main surface of the drive element 120. The rod 130 is in a shape of an approximately polygonal prism so that it has large contact area to the shaft 116, and for example, formed of metal. The drive element 120 is in a layered structure via electrodes in order to obtain submicron displacement even in a non-resonant state, as in the embodiment 1.

A more detailed structure of the drive element 120 is described with reference to FIGS. 9A to 9C and FIGS. 10A1 to 10B2. The drive element 120 is in a structure where a plurality of pieces of piezoelectrics 132A to 132L and a plurality of internal electrodes EA1, EA2, EB1, EB2 and EG are layered. The piezoelectrics 132A is disposed at an uppermost layer, and the internal electrodes EA1, EA2, EB1 and EB2 are provided between the piezoelectrics 132A and piezoelectrics 132B as underlayer thereof. Among them, the internal electrodes EA1 and EA2 are in a pattern of point symmetry about the center of the element, and the internal electrodes EB1 and EB2 are also in a pattern of point symmetry about the center of the element. That is, they are disposed around the center of the element in the order of EA1, EA2, EB1, EB2, EA1 . . . . The internal electrodes EA1 and EB2 have leading portions 134 and 140 extended in a -Y direction, and the internal electrodes EB1 and EA2 have leading portions 138 and 136 extended in a Y direction. The extended direction of the leading portions 134 to 140 are the same as in the case that the drive element 120 is set in a direction as shown in FIGS. 8A to 8C and FIGS. 9A to 9C.

Next, internal electrodes EG to be ground electrodes are provided between the piezoelectrics 132B and the piezoelectrics 132C. The internal electrodes EG are dividedly formed into four pieces such that positions of them are corresponding to those of the internal electrodes EA1, EA2, EB1 and EB2, and have leading portions 142 of the electrodes respectively. For internal electrodes EG being overlapped with the internal electrodes EA1 and EB1, the leading portions 142 are extended in a -X direction, and for internal electrodes EG being overlapped with the internal electrodes EB2 and EA2, the leading portions 142 are extended in an X direction. As internal electrodes interposed between subsequent piezoelectrics 132C to 132L, the internal electrodes (EA1, EA2, EB1 and EB2) and the internal electrodes EG are repeatedly formed, and a layered product 122 is thus obtained. p As shown in FIGS. 10A1, 10A2, 10B1 and 10B2, in the layered product 122, the leading portions 142 of the internal electrodes EG are exposed side by side on a pair of side faces opposed to each other, and terminal electrodes 128 are connected thereto. In the case of the embodiment, four terminal electrodes 128 are connected. The leading portion 134 of the internal electrode EA1 and the leading portion 140 of the internal electrode EB2 are exposed side by side on another side face of the layered product 122, and terminal electrodes 124 and 127 are connected to them respectively. The leading portion 136 of the internal electrode EA2 and the leading portion 138 of the internal electrode EB1 are exposed side by side on still another side face of the layered product 122, and terminal electrodes 125 and 126 are connected to them respectively. The same materials as in the embodiment 1 are used for the piezoelectrics 132A to 132L, internal electrodes EA1, EA2, EB1, EB2 and EG, and terminal electrodes 124, 125, 126, 127 and 128.

As shown in FIGS. 8A to 8C, one end of the rod 130 is adhered to an approximate center of a main surface of the drive element 120 by an appropriate method. A driving power supply 60 (input A) is connected between the terminal electrodes 124 and 128 and between the terminal electrodes 125 and 128 of the drive element 120, and a driving power supply 62 (input B) is connected between the terminal electrodes 127 and 128. When two signals having different phases with respect to the internal electrodes EG are inputted into the internal electrodes EA1, EA2 and the electrodes EB1, EB2, four regions having different displacement in thickness of the element from one another are formed with the center of the drive element 120 as an origin. All the internal electrodes EA1, EA2, EB1 and EB2 are polarized in the same direction here. Since positional part of phase is shifted by 90 degrees between adjacent distributions, when two signals between which time part of phase is shifted by 90 degrees are inputted into the internal electrodes EA1 and EA2, and the internal electrodes EB1 and EB2 respectively, portions divided in four in one drive element 120 are displaced about an axis of the rod 130, and consequently a progressive wave is generated. That is, as shown in FIG. 9C, the drive element 120 has four regions P, Q, R and S having different displacement in a thickness direction. Thus, the rod 130 makes a rotational movement while being inclined as shown by an arrow F8 in FIG. 8A.

It was confirmed that when the drive element 120 of the embodiment was inputted with a driving signal as shown in the following table 2, in the case that the internal electrodes EA1 and EA2 have a phase advanced by 90 degrees with respect to the internal electrodes EB1 and EB2, the rod 130 was rotated clockwise (CW), and in the case that phase difference was -90 degrees, it was rotated counterclockwise (CCW).

TABLE 2

| Input | CW | CCW |
| --- | --- | --- |
| A | E cos ωt | E sin ωt |
| B | E sin ωt | E cos ωt |

Next, operation of the embodiment is described. As shown in FIGS. 7A to 7B, the drive element 120 in the above configuration is attached in the opening 108 of the protrusion 104 of the frame 102 via the spring 114 such that the rod 130 is disposed to be approximately perpendicular to the shaft 116, and side faces of the rod 130 and the shaft 116 are contacted to each other. Then, due to friction induced between the rod 130 pressed to the shaft 116 by the spring 114 and the shaft 116, the frame 102 is displaced upward (in a direction of an arrow F7a in FIG. 7B) when the rod 130 is rotated CW (clockwise), and the rod 130 is displaced downward (in a direction of an arrow F7b in FIG. 7B) when the rod 130 is rotated CCW (counterclockwise).

Even if internal electrodes of the drive element 120 are dividedly formed to form the four regions having different displacement in the thickness direction of the element as in the embodiment 2, the same advantages as in the embodiment 1 are obtained.

Figure 11A:
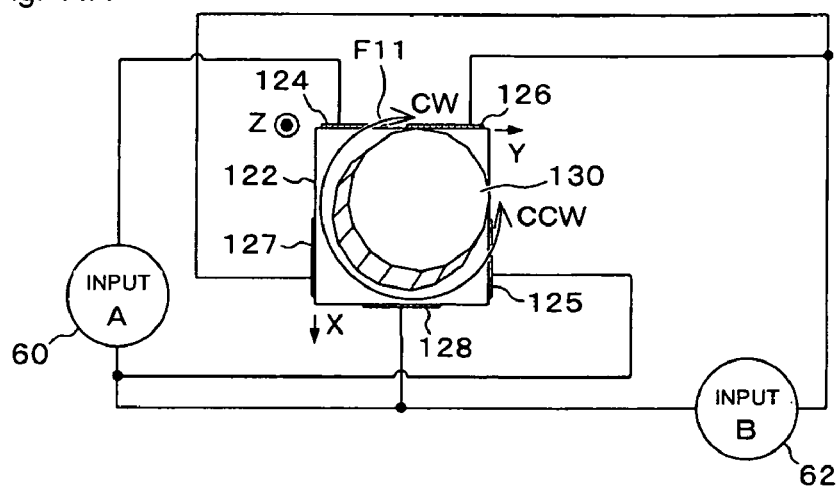
Figure 11B:
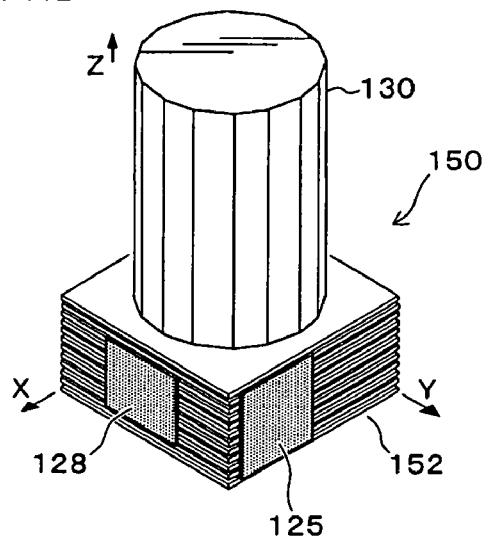
Figure 11C:
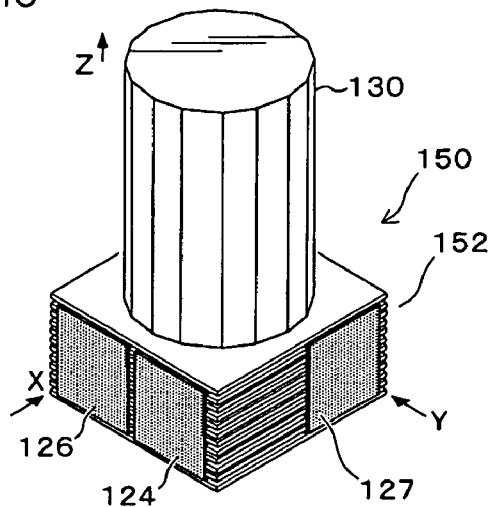
Figure 12A:
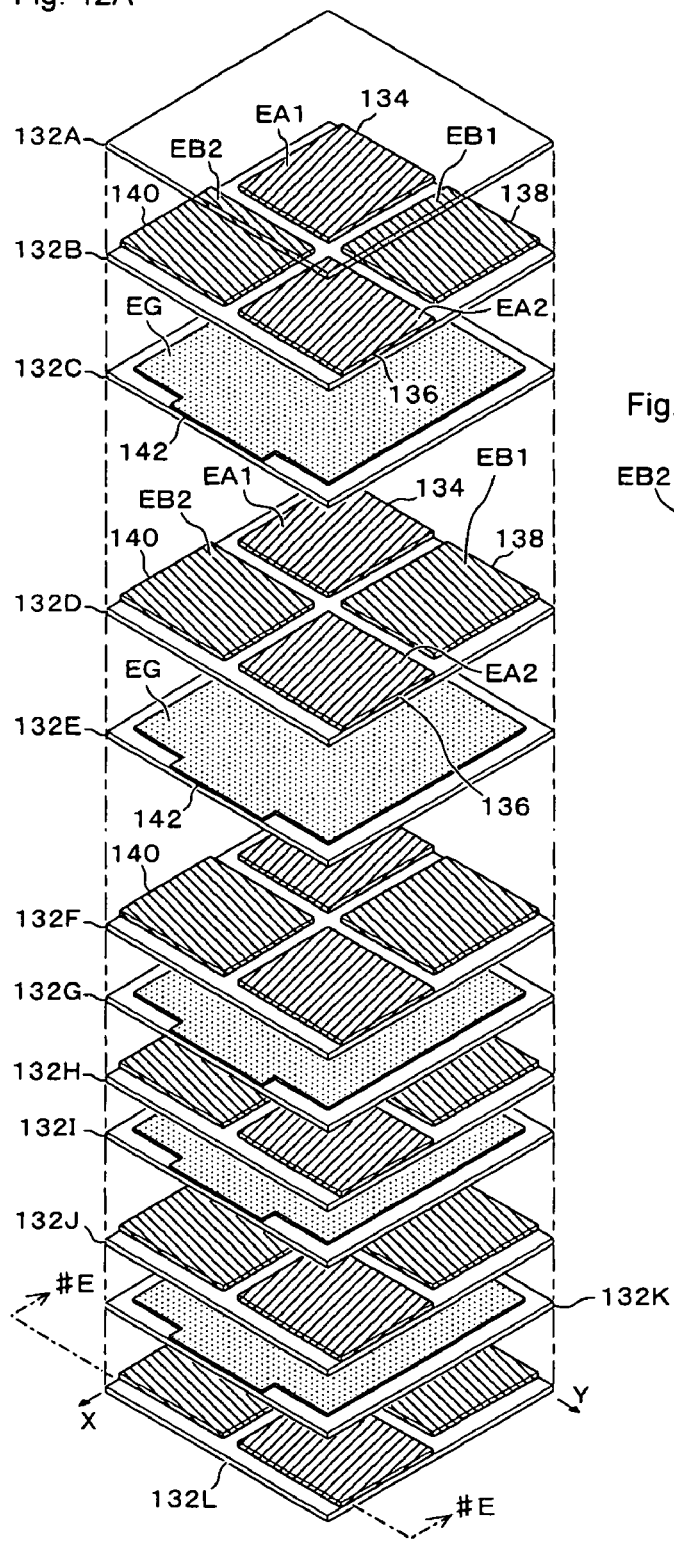
Figure 12B:
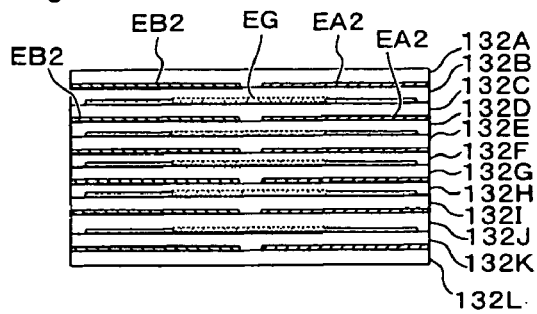

Next, embodiment 3 of the invention will be described with reference to FIGS. 11A to 13B2. The embodiment is an example where four regions having different displacement in a thickness direction of the element are formed as the embodiment 2, and a division pattern of internal electrodes is modified. A basic configuration of the piezoelectric drive unit is the same as in the embodiment 2. FIG. 11A is a front view of a drive element 150 and a rod 130 of the embodiment, and FIGS. 11B and 11C are perspective views of them. FIG. 12A is an exploded perspective view showing a layered structure of the drive element 150, FIG. 12B is a cross section view along a line #E-#E of the FIG. 12A, which is seen in an arrow direction. FIGS. 13A1 to 13B2 are perspective views of the drive element 150, wherein FIGS. 13A1 and 13A2 are views showing leading portions of the internal electrodes, and FIGS. 13B1 and 13B2 are views showing arrangement of terminal electrodes. As shown in FIGS. 11A to 11C, one end of the rod 130 is fixed to an approximate center of a main surface of the drive element 150.

A detailed structure of the drive element 150 is described with reference to FIGS. 12A to 12B and FIGS. 13A1 to 13B2. The drive element 150 is in a structure where a plurality of pieces of piezoelectrics 132A to 132L and a plurality of internal electrodes EA1, EA2, EB1, EB2 and EG are layered. The piezoelectrics 132A is disposed at an uppermost layer, and the internal electrodes EA1, EA2, EB1, EB2 and EG being dividedly formed are provided between the piezoelectrics 132A and piezoelectrics 132B as underlayer thereof. The internal electrodes EA1 and EB1 or the internal electrodes EA2 and EB2 are in symmetry with respect to an X axis. These internal electrodes are disposed around the center of the element in the order of EA1, EB1, EA2, EB2, EA1 . . . . The internal electrodes EA1 and EB1 have leading portions 134 and 138 extended in a −X direction, the internal electrode EA2 has a leading portion 136 extended in a Y direction, and the internal electrode EB2 has a leading portion 140 extended in a −Y direction.

Next, an internal electrode EG to be a ground electrode is provided between the piezoelectrics 132B and 132C. The internal electrode EG has a size of overlapping with all the internal electrodes EA1, EA2, EB1 and EB2, and is not dividedly formed unlike the embodiment 2. The internal electrode EG has a leading portion 142 of the electrode, being extended in the X direction. As internal electrodes interposed between subsequent piezoelectrics 132C to 132L, the internal electrodes (EA1, EA2, EB1 and EB2) and the internal electrode EG are repeatedly formed, and a layered product 152 is thus obtained.

As shown in FIGS. 13A1, 13A2, 13B1 and 13B2, in the layered product 152, the leading portion 142 of the internal electrode EG is exposed on one side face, and a terminal electrode 128 is connected thereto. Similarly, a leading portion 136 of the internal electrode EA2 is exposed on another side face, and a terminal electrode 125 is connected thereto. A leading portion 138 of the internal electrode EB1 and a leading portion 134 of the internal electrode EA1 are exposed side by side on still another side face, and terminal electrodes 126 and 124 are connected thereto respectively. A leading portion 140 of the internal electrode EB2 is exposed on still another side face, and a terminal electrode 127 is connected thereto.

As shown in FIGS. 11A to 11C, one end of the rod 130 is adhered to an approximate center of a main surface of the drive element 150 by an appropriate method. The terminal electrodes 124 and 125 of the drive element 150 are connected to a driving power supply 60, and the terminal electrodes 126 and 127 and the terminal electrode 128 are connected to a driving power supply 62. In the embodiment, polarization directions of the internal electrodes EA1 and EA2 or the internal electrodes EB1 and EB2 are opposite to each other (the internal electrodes EA1 and EB1 have the same polarization direction). Thus, the drive element 150 has four regions P, Q, R and S having different displacement in a thickness direction as shown in the FIG. 9C, as in the embodiment 2. Therefore, when two signals between which time part of phase is shifted by 90 degrees are inputted into the internal electrodes EA1 and EA2, as well as the internal electrodes EB1 and EB2 respectively, portions divided in four in one drive element 150 are displaced about an axis of the rod 130, consequently a progressive wave is generated, and thus the rod 130 makes a rotational movement while being inclined as shown by an arrow F11 in FIG. 11A. Basic operation and effects of the embodiment are the same as in the embodiment 2.

Figure 14A:
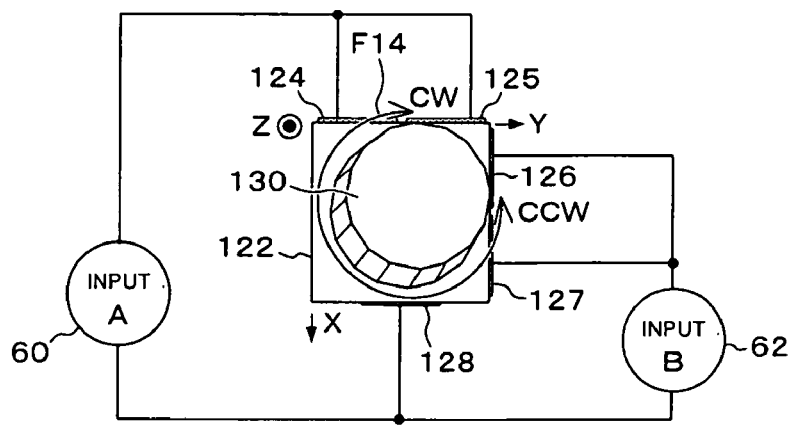
Figure 14B:
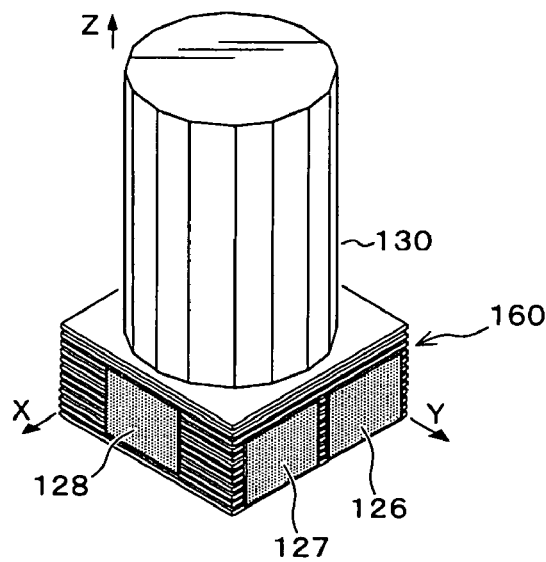
Figure 14C:
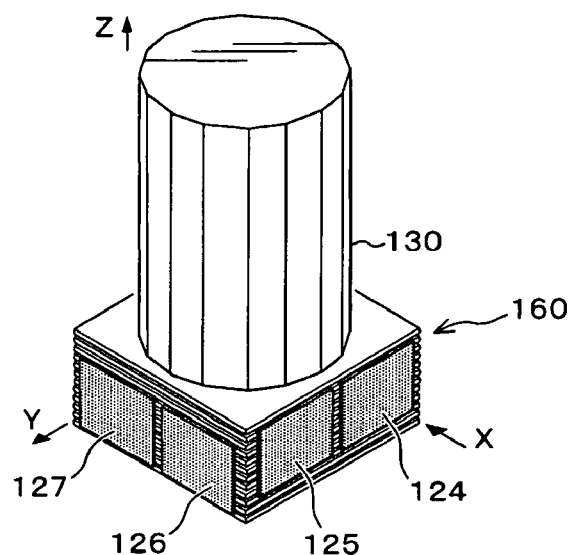

Next, embodiment 4 of the invention will be described with reference to FIGS. 14A to 17B2. The embodiment is also an example where a pattern of internal electrodes of the drive element is modified as embodiment 3, and a basic configuration of a drive unit 100 is the same as in the embodiment 2. FIG. 14A is a front view of a drive element 160 and the rod 130, and FIGS. 14B and 14C are perspective views of them. FIG. 15A is an exploded perspective view showing a layered structure of the drive element 160, FIG. 15B is a cross section view along a line #F-#F of the FIG. 15A, which is seen in an arrow direction. FIGS. 16A1 to 16B2 are perspective views of the drive element 160, wherein FIGS. 16A1 and 16A2 are views showing leading portions of the internal electrodes, and FIGS. 16B1 and 16B2 are views showing arrangement of terminal electrodes. As shown in FIGS. 14A to 14C, one end of the rod 130 is fixed to an approximate center of a main surface of the drive element 160.

A detailed structure of the drive element 160 is described with reference to FIGS. 15A to 15B and FIGS. 16A1 to 16B2. The drive element 160 is in a structure where a plurality of pieces of piezoelectrics 132A to 132L and a plurality of internal electrodes EA1, EA2, EB1, EB2 and EG are layered. The piezoelectrics 132A is disposed at an uppermost layer, and the internal electrodes EA1 and EA2 being dividedly formed are provided between the piezoelectrics 132A and piezoelectrics 132B as underlayer thereof. The internal electrodes EA1 and EA2 are in a pattern of mirror reversed image with respect to an X axis, and the internal electrode EA1 has a leading portion 134, and the internal electrode EA2 has a leading portion 136. Both the leading portions 134 and 136 are extended in a −X direction.

Next, an internal electrode EG to be a ground electrode is provided between the piezoelectrics 132B and the piezoelectrics 132C. The internal electrode EG has a leading portion 142 of the electrode, being extended in the X direction. Furthermore, internal electrodes EB1 and EB2 being dividedly formed are provided between the piezoelectrics 132C and the piezoelectrics 132D. The internal electrodes EB1 and EB2 are in a pattern of mirror reversed image with respect to a Y axis, and have a division direction rotated from that of the internal electrodes EA1 and EA2. The internal electrodes EB1 and EB2 have leading portions 138 and 140 of the electrodes, being extended in a Y direction respectively. The internal electrode EG is provided between the piezoelectrics 132D and the piezoelectrics 132E. As internal electrodes interposed between subsequent piezoelectrics 132E to 132L, the internal electrodes (EA1 and EA2), the internal electrode EG, the internal electrodes (EB1 and EB2), and the internal electrode EG are repeatedly formed, and a layered product 162 is thus obtained.

As shown in FIGS. 16A1, 16A2, 16B1 and 16B2, in the layered product 162, the leading portion 142 of the internal electrode EG is exposed on one side face, and a terminal electrode 128 is connected thereto. Similarly, a leading portion 138 of the internal electrode EB1 and a leading portion 140 of the internal electrode EB2 are exposed side by side on another side face, and terminal electrodes 126 and 127 are connected thereto respectively. A leading portion 134 of the internal electrode EA1 and a leading portion 136 of the internal electrode EA2 are exposed side by side on still another side face, and terminal electrodes 124 and 125 are connected thereto respectively.

As shown in FIGS. 14A to 14C, one end of the rod 130 is adhered to an approximate center of a main surface of the drive element 160 by an appropriate method. A driving power supply 60 is connected between the terminal electrodes 124, 125 and the terminal electrode 128 of the drive element 160, and a driving power supply 62 is connected between the terminal electrodes 126, 127 and the terminal electrode 128. Again in the embodiment, polarization directions of the internal electrodes EA1 and EA2 or the internal electrodes EB1 and EB2 are opposite to each other as in the embodiment 3 (the internal electrodes EA1 and EB1 have the same polarization direction), and thus the drive element 160 has four regions P, Q, R and S having different displacement in a thickness direction as shown in the FIG. 9C. Therefore, when two signals between which time part of phase is shifted by 90 degrees are inputted into the internal electrodes EA1 and EA2, as well as the internal electrodes EB1 and EB2 respectively, portions divided in four in one drive element 160 are displaced about an axis of the rod 130, consequently a progressive wave is generated, and thus the rod 130 makes a rotational movement while being inclined as shown by an arrow F14 in FIG. 14A. Basic operation and effects of the embodiment are the same as in the embodiment 2.

Figure 17:
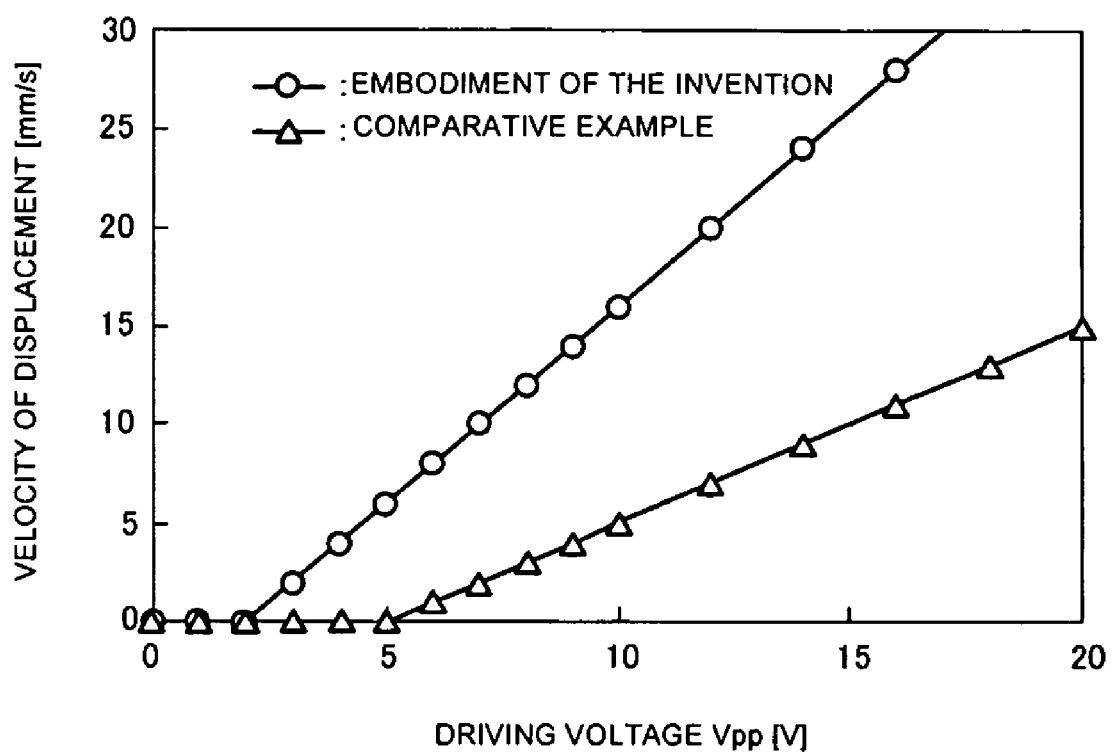
FIG. 17 is view showing a relationship between velocity of displacement of a lens and a driving voltage for each of the embodiment 4 and a comparative example.

FIG. 17 shows a measurement result showing a relationship between a driving voltage of the drive element 160 and velocity of displacement of the lens 12 for each of the embodiment and a comparative example. In FIG. 17, a horizontal axis shows the driving voltage Vpp (V), and a vertical axis shows the velocity of displacement (mm/s) of the lens 12. The comparative example has the same configuration as that of the drive unit in the related art as shown in FIG. 18A. As shown in FIG. 17, it was confirmed that the element was started to be driven at low voltage, and furthermore the velocity of displacement was high in the embodiment 4 compared with the comparative example.

The invention is not limited to the embodiments, and can be variously altered or modified within a scope without departing from the gist of the invention. For example, the following are also included.

(1) The materials, shapes, and dimensions shown in the embodiments are shown as an example, and can be appropriately modified so that similar advantages are exhibited.

(2) The arrangement or division number of the internal electrodes and the terminal electrodes shown in the embodiments is also shown as an example, and can be appropriately modified in design so that similar advantages are exhibited. For example, while two or four regions are formed in the aforementioned embodiments, a configuration in which further more distributions are formed may be used as necessary.

(3) The layered structure of the drive element (piezoelectric drive element) in a layered type and leading structures of electrodes are also shown as an example, and can be appropriately modified as necessary.

(4) The shafts 16, 18, 116 and 118 are also shown as an example, and may be in a cylindrical or prismatic shape. Similarly, the rods 40 and 130 may be in the cylindrical or prismatic shape. Moreover, while the tip 42 of the rod 40 is formed to have a curved surface in the embodiment 1, it will not be prevented to be formed to have a flat surface. Furthermore, the frame 14 or 102 is also shown as an example, and it may be in any configuration if it can be displaced along the shafts 16 and 18, or 116 and 118. Furthermore, a configuration where the frame 14 or 102 and the lens 12 are integrated may be used.

(5) While the drive element 30, 120, 150, or 160 is fixed to the frame for holding the lens 12 in the embodiments, this is also shown as an example, and a configuration may be used, in which the drive element 30, 120, 150, or 160 is fixed to a stationary member, and a bodytube attached with the lens 12 is displaced.

(6) The drive units of the embodiments are shown as an example, and certain embodiments can be used for driving lenses in an optical instrument, such as a photo-lens of a camera, a projection lens of an overhead projector or the like, lenses of binoculars, and a lens of a copier, in addition, can be used for a typical unit having a drive section including a unit such as a plotter or an X-Y drive table.

According to an embodiment of the invention, when a displaced body is driven by a rod fixed to a main surface of a piezoelectric drive element at one end, torque is generated in the rod by one piezoelectric drive element, thereby the displaced body is driven. Therefore, since fixing strength is efficiently restrained or shut off, so that stable and fast displacement is enabled at low voltage, an embodiment of the invention is preferable for an application of a drive unit where stable operation is required. Particularly, it is preferable for an application of an ultrasonic motor and other drive units, which are required to be compact, lightweight, and small in thickness.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A piezoelectric drive unit comprising:

a rod for driving a displaced body; and a piezoelectric drive element for generating rotational motion of the rod for driving the displaced body, wherein one end of the rod is fixed to a main surface of the piezoelectric drive element at an approximate center of the main surface, said piezoelectric drive element comprising:

a layered product comprising piezoelectrics and electrodes alternately layered in a thickness direction perpendicular to the main surface, wherein the electrodes comprise internal electrodes and ground electrodes alternatively disposed in the thickness direction, each layer of the internal electrodes being divided into four electrode pieces as regions which are symmetrically disposed with respect to the fixed end of the rod and are different in displacement in a thickness direction between adjacent regions; and terminal electrodes formed outside of the layered product along the thickness direction, each electrode piece and each ground electrode having a leading portion which is exposed outside of the layered product and connected to the terminal electrodes, wherein the rod is rotatable while being inclined such that a center of an unfixed end of the rod opposite to the fixed end of the rod is circulated on a plane parallel to the main surface when the four electrode nieces are sequentially activated, and wherein the rod has a side face extending from the fixed end to the unfixed end, said side face being adapted to contact a member for moving the same.

2. The piezoelectric drive unit according to claim 1, further comprising:

a shaft as the member in contact with the rod configured to guide the displaced body in motion of displacement, and a biasing element configured to engage the rod to the shaft.

3. A method of moving a body along a linear direction comprising:

coupling the shaft which is the body to the piezoelectric drive unit of claim 2 at the rod;

rotating the rod in a selected direction with piezoelectric distortion of the piezoelectric element; and translating the rotational motion of said rod into linear motion of said shaft.

4. The method of claim 3, wherein the linear motion is 5 mm/second or greater.

5. The method of claim 3, comprising applying at least two phase shifted voltage signals to the piezoelectric element to cause said piezoelectric distortion.

6. The piezoelectric drive unit according to claim 1, wherein each of the four electrode pieces is shaped in an approximate square.

7. The piezoelectric drive unit according to claim 1, wherein all of the regions which are arranged at the same position along the thickness direction are connected to the same terminal electrode.

8. A method of rotating a displaced body using the piezoelectric drive unit of claim 1, comprising:

inputting a same driving signal to two of the four electrode pieces diagonal to each other in each internal electrode layer, while inputting different driving signals to two of the four electrode pieces adjacent to each other, said different driving signals being phase-shifted by 90 degrees from each other, generating a progressive wave and circulating the center of the unfixed end of the rod on a plane parallel to the main surface with respect to the fixed end of the rod while being inclined with respect to an axis perpendicular to the main surface, and moving the member in contact with the side face of the rod by the circulating motion of the rod.

9. The piezoelectric drive unit according to claim 1, wherein the rod is in a shape of an approximately polygonal prism so as to increase a contact area of the side face to the member.

* * * * *

UNITED STATES PATENT AND TRADEMARK OFFICE
CERTIFICATE OF CORRECTION

PATENT NO.        : 7,772,743 B2                                        Page 1 of 1
APPLICATION NO.   : 11/652811
DATED             : August 10, 2010
INVENTOR(S)       : Yutaka Doshida It is certified that error appears in the above-identified patent and that said Letters Patent is hereby corrected as shown below:

In Claim 1 in line 31 of column 13, please correct the word "nieces" to --pieces--.

Signed and Sealed this

Fifth Day of October, 2010

David J. Kappos
*Director of the United States Patent and Trademark Office*